(12) United States Patent
Okinaka et al.

(10) Patent No.: US 7,491,450 B2
(45) Date of Patent: Feb. 17, 2009

(54) ORGANIC ELECTROLUMINESCENT DEVICE

(75) Inventors: Keiji Okinaka, Kanagawa (JP); Akihito Saitoh, Kanagawa (JP); Koichi Suzuki, Kanagawa (JP); Akihiro Senoo, Kanagawa (JP); Kazunori Ueno, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 296 days.

(21) Appl. No.: 10/875,242

(22) Filed: Jun. 25, 2004

(65) Prior Publication Data

US 2004/0265632 A1     Dec. 30, 2004

(30) Foreign Application Priority Data

Jun. 27, 2003  (JP) .............................. 2003-184262
May 20, 2004  (JP) .............................. 2004-149953

(51) Int. Cl.
*H01L 51/50* (2006.01)
(52) U.S. Cl. .................. 428/690; 428/917; 313/504; 313/506
(58) Field of Classification Search ................ 428/690, 428/917; 313/504, 506
See application file for complete search history.

(56) References Cited

U.S. PATENT DOCUMENTS 4,539,507 A    9/1985   Van Slyke et al. ........... 313/504

(Continued)

FOREIGN PATENT DOCUMENTS

EP    0 681 019 A2    11/1995

(Continued)

OTHER PUBLICATIONS

Burroughs et al., "Light-Emitting Diodes Based on Conjugated Polymers", *Nature*, vol. 347, Oct. 11, 1990, pp. 539-541.

(Continued)

*Primary Examiner*—Dawn Garrett
(74) *Attorney, Agent, or Firm*—Fitzpatrick, Cella, Harper & Scinto

(57) ABSTRACT

Provided is an organic electroluminescent device having a high-efficiency optical output with high luminance and long life, which includes at least: a pair of electrodes comprising an anode and a cathode; and one or more organic-compound-containing layers sandwiched between the pair of electrodes, and in which among the organic-compound-containing layers, at least one layer having a light-emitting region contains a first compound represented by the following general formula [1] and a second compound having a band gap larger than a band gap of the first compound.

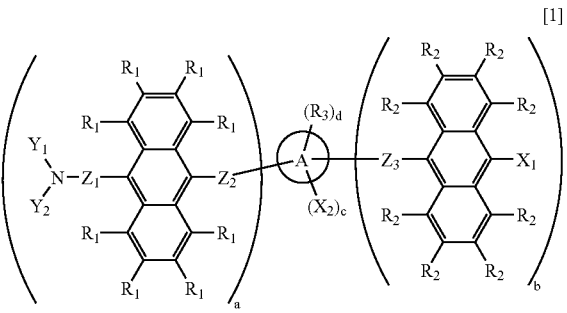

3 Claims, 3 Drawing Sheets

U.S. PATENT DOCUMENTS

| | | | |
|---|---|---|---|
| 4,720,432 A | 1/1988 | Van Slyke et al. | 428/457 |
| 4,885,211 A | 12/1989 | Tang et al. | 428/457 |
| 5,130,603 A | 7/1992 | Tokailin et al. | 313/504 |
| 5,151,629 A | 9/1992 | Van Slyke | 313/504 |
| 5,227,252 A | 7/1993 | Murayama et al. | 428/690 |
| 5,247,190 A | 9/1993 | Friend et al. | 257/40 |
| 5,317,169 A | 5/1994 | Nakano et al. | 257/40 |
| 5,382,477 A | 1/1995 | Saito et al. | 428/690 |
| 5,409,783 A | 4/1995 | Tang et al. | 428/690 |
| 5,514,878 A | 5/1996 | Holmes et al. | 257/40 |
| 5,635,308 A | 6/1997 | Inoue et al. | 428/690 |
| 5,672,678 A | 9/1997 | Holmes et al. | 528/373 |
| 5,726,457 A | 3/1998 | Nakano et al. | 257/40 |
| 5,759,444 A | 6/1998 | Enokida et al. | 252/301.16 |
| 6,093,864 A | 7/2000 | Tokailin et al. | 585/25 |
| 6,251,531 B1 | 6/2001 | Enokida et al. | 428/690 |
| 6,534,199 B1 | 3/2003 | Hosokawa et al. | 428/690 |
| 6,582,837 B1 | 6/2003 | Toguchi et al. | 428/690 |
| 6,652,997 B2 | 11/2003 | Suzuki et al. | 428/690 |
| 6,660,408 B1 | 12/2003 | Toguchi et al. | 428/690 |
| 6,713,192 B2 | 3/2004 | Fukuoka et al. | 428/690 |
| 2002/0048687 A1 | 4/2002 | Hosokawa et al. | 428/690 |
| 2002/0048688 A1 | 4/2002 | Fukuoka et al. | 428/690 |
| 2002/0177009 A1 | 11/2002 | Suzuki et al. | 428/690 |
| 2003/0039838 A1* | 2/2003 | Chen et al. | 428/411.1 |
| 2003/0087126 A1 | 5/2003 | Ishida et al. | 428/690 |
| 2004/0253389 A1* | 12/2004 | Suzuki et al. | 428/1.1 |
| 2005/0106414 A1* | 5/2005 | Saitoh et al. | 428/690 |

FOREIGN PATENT DOCUMENTS

| | | |
|---|---|---|
| EP | 1 167 488 A1 | 1/2002 |
| EP | 1 182 183 A1 | 2/2002 |
| EP | 1 221 434 A1 | 7/2002 |
| JP | 2-247278 | 10/1990 |
| JP | 3-255190 | 11/1991 |
| JP | 4-145192 | 5/1992 |
| JP | 5-202356 | 8/1993 |
| JP | 5-247460 | 9/1993 |
| JP | 8-12600 | 1/1996 |
| JP | 9-157643 | 6/1997 |
| JP | 9-202878 | 8/1997 |
| JP | 9-227576 | 9/1997 |
| JP | 10-72579 | 3/1998 |
| JP | 11-8068 | 1/1999 |
| JP | 11-111460 | 4/1999 |
| JP | 11-111460 A * | 4/1999 |
| JP | 11-339963 | 12/1999 |
| JP | 3008897 | 12/1999 |
| JP | 2000-273056 | 10/2000 |
| JP | 2001-284050 | 10/2001 |
| WO | WO 03/080559 A1 | 10/2003 |

OTHER PUBLICATIONS

Tang et al., "Organic Electroluminescent Diodes", *Appl. Phys. Lett.*, vol. 51, No. 12, Sep. 21, 1987, pp. 913-915.

* cited by examiner

ORGANIC ELECTROLUMINESCENT DEVICE

BACKGROUND OF THE INVENTION

1. Field of the Invention

The present invention relates to an electroluminescent device using an organic compound, and more particularly, to an organic electroluminescent device from which light is emitted by applying an electric field on a thin film made of an organic compound.

2. Related Background Art

An organic electroluminescent device is a device that includes a thin film made of a fluorescent organic compound between an anode and a cathode, generates an exciton from the fluorescent organic compound by injection of an electron and a hole from each electrode, and utilizes light to be radiated when the exciton returns to the ground state.

The study conducted by Eastman Kodak Company in 1987 (Non-Patent Document 1) reported light emission on the order of 1,000 cd/m$^2$ at an applied voltage of about 10 V, from a device having a separated-function type two-layer structure where an anode is made of ITO and a cathode is made of magnesium-silver alloy, an aluminum quinolinol complex is used as each of an electron-transporting material and a light-emitting material, and also a triphenylamine derivative is used as a hole-transporting material. In this case, related patent documents include Patent Documents 1 to 3.

In addition, light emission at spectra ranging from ultraviolet through infra-red is allowed by changing the type of the fluorescent organic compound. Recently, therefore, various compounds have been studied extensively and described in, for example, Patent Documents 4 to 11.

Furthermore, in addition to the organic electroluminescent devices using low molecular weight materials as described above, an organic electroluminescent device using a conjugated polymer has been reported from the group of the Cambridge University (Non-Patent Document 2). This report confirmed light emission from a monolayer by film formation with polyphenylene vinylene (PPV) in a coating system. Patents related to the organic electroluminescent device using the conjugated polymer include Patent Documents 12 to 16.

Recent advances in technology concerning organic electroluminescent devices are remarkable and the characteristics thereof allow the formation of thin and lightweight electroluminescent devices having high luminance at a low applied voltage, a variety of emission wavelengths, and high-speed response, suggesting the possibility to extensive uses.

However, many problems still remain to be solved in terms of durability, such as changes over time by prolonged use, or degradation with atmospheric gasses including oxygen, humidity, or the like. Considering applications to full-color displays and so on, under present circumstances, high-luminance optical output and high-efficiency emission have been demanded.

As examples of the materials for organic electroluminescent devices containing anthracene rings, phenyl anthracene derivatives are disclosed in Patent Document 17. In particular, when used as a blue light-emitting material or an electron-injection transporting material, the derivatives are assumed to allow the formation of a good organic film because of its low crystallinity. However, the light-emitting efficiency and useful life thereof are insufficient in practical use.

As other examples, an aminoanthracene derivative and a diaminoanthracene derivative have been disclosed in Patent Documents 18 and 19, respectively. In the documents, those materials are assumed to emit green light when used as light-emitting materials. However, devices prepared from those materials have insufficient light-emitting efficiencies and their useful lives are still insufficient in practical use.

As another example, Patent Document 20 discloses a device using a specific bianthryl compound as a light-emitting material, which is assumed to attain light emission with high luminance. However, there is no description about light-emitting efficiency and useful life.

As still another example, Patent Document 21 discloses a device using a specific anthracene compound having an olefin portion as a light-emitting material, which is assumed to obtain light emission from yellow to red. However, the device has insufficient light-emitting efficiency in practical use.

Furthermore, as yet another example, Patent Document 22 discloses a device that contains an anthracene derivative having a specific structure, an electron-transporting compound, and another fluorescent compound in a light-emitting medium layer. It is assumed to obtain a red light-emitting device with improved reliability. However, the device has insufficient light-emitting efficiency in practical use. In addition, it is difficult to obtain blue light emission because of its device configuration.

[Patent Documents]
1. U.S. Pat. No. 4,539,507 B
2. U.S. Pat. No. 4,720,432 B
3. U.S. Pat. No. 4,885,211 B
4. U.S. Pat. No. 5,151,629 B
5. U.S. Pat. No. 5,409,783 B
6. U.S. Pat. No. 5,382,477 B
7. JP H02-247278 A
8. JP H03-255190 A
9. JP H05-202356 A
10. JP H09-202878 A
11. JP H09-227576 A
12. U.S. Pat. No. 5,247,190 B
13. U.S. Pat. No. 5,514,878 B
14. U.S. Pat. No. 5,672,678 B
15. JP H04-145192 A
16. JP H05-247460 A
17. JP H08-012600 A
18. JP H09-157643 A
19. JP H10-072579 A
20. JP 3008897 B
21. JP H11-008068 A
22. JP 2001-284050 A

[Non-Patent Documents]
1. Appl. Phys. Lett., 51, 913 (1987)
2. Nature, 347, 539 (1990)

SUMMARY OF THE INVENTION

An object of the present invention is to provide an organic electroluminescent device having a high-efficiency optical output with high luminance and long life.

The inventors of the present invention have made extensive studies for solving the above problem and finally accomplished the present invention.

More specifically, an organic electroluminescent device according to the present invention includes: a pair of electrodes consisting of an anode and a cathode; and one or more organic-compound-containing layers sandwiched between the pair of electrodes, in which among the organic-compound-containing layers, at least one layer having a light-emitting region contains a first compound represented by the following general formula [1] and a second compound having a band gap larger than a band gap of the first compound:

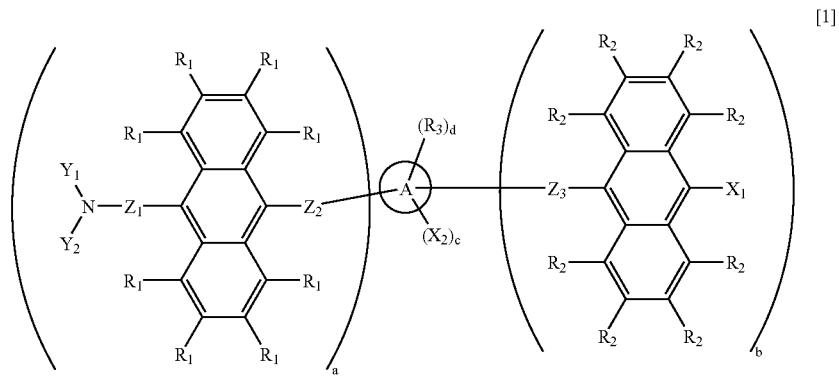

[1]

(where:

A represents a molecular unit containing an aromatic ring, a condensed polycyclic ring, or a heterocyclic ring;

$Y_1$ and $Y_2$ each represent one selected from the group consisting of substituted or unsubstituted alkyl group, aralkyl group, aryl group, and heterocyclic group, and a divalent substituent having a linking group, which may be identical with or different from each other, where $Y_1$ and $Y_2$ may be linked together to form a ring, or $Y_1$ and $Y_2$ on different anthryl groups may be identical with or different from each other;

$Z_1$ represents one selected from the group consisting of a direct bond, substituted or unsubstituted arylene group and divalent heterocyclic group, and a divalent substituent having a linking group, which may be identical with or different from each other;

$Z_2$ and $Z_3$ each represent one selected from the group consisting of a direct bond, substituted or unsubstituted alkylene group, alkenylene group, alkynylene group, aralkylene group, arylene group, and divalent heterocyclic group, and a divalent substituent having a linking group, which may be identical with or different from each other;

$X_1$ represents one selected from the group consisting of a hydrogen atom, a heavy hydrogen atom, a halogen atom, substituted or unsubstituted alkyl group, alkenyl group, alkynyl group, aralkyl group, alkoxy group, and sulfide group, an aryl group, and a heterocyclic group, a substituted silyl group, a boranyl group, and a divalent substituent having a linking group, which may be identical with or different from each other;

$X_2$ represents one selected from the group consisting of a substituted or unsubstituted aryl group and heterocyclic group and a divalent substituent having a linking group, which may be identical with or different from each other;

$R_1$ and $R_2$ each represent one selected from the group consisting of a hydrogen atom, a heavy hydrogen atom, a halogen atom, and substituted or unsubstituted alkyl group, aryl group, alkoxy group, and amino group, which may be identical with or different from each other;

$R_3$ represents one selected from the group consisting of a hydrogen atom, a heavy hydrogen atom, a halogen atom, and substituted or unsubstituted alkyl group, and alkoxy group, which may be identical with or different from each other; and a represents an integer of 0 to 6, and b+c+d=6−a, where a+b equals an integer of 2 or more, and when a=0, at least one of $X_1$ on the anthryl group contains a substituent except a hydrogen atom, a heavy hydrogen atom, and a halogen atom).

In the organic electroluminescent device according to the present invention, the first compound is represented by the following general formula [2]:

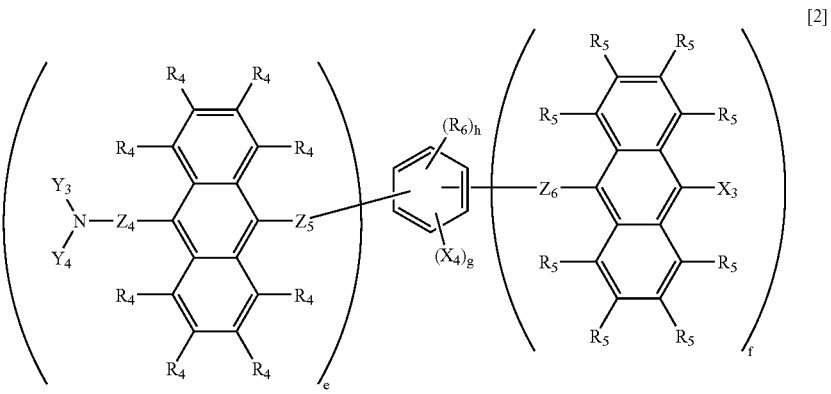

[2]

(where:

$Y_3$ and $Y_4$ each represent one selected from the group consisting of substituted or unsubstituted alkyl group, aralkyl group, aryl group, and heterocyclic group, and a divalent substituent having a linking group, which may be identical with or different from each other, where $Y_3$ and $Y_4$ may be linked together to form a ring, or $Y_3$ and $Y_4$ on different anthryl groups may be identical with or different from each other;

$Z_4$ is one selected from the group consisting of a direct bond, substituted or unsubstituted arylene group and divalent heterocyclic group, and a divalent substituent having a linking group, which may be identical with or different from each other;

$Z_5$ and $Z_6$ each represent one selected from the group consisting of a direct bond, substituted or unsubstituted alkylene group, alkenylene group, alkynylene group, aralkylene group, arylene group, and divalent heterocyclic group, and a divalent substituent having a linking group, which may be identical with or different from each other;

$X_3$ represents one selected from the group consisting of a hydrogen atom, a heavy hydrogen atom, a halogen atom, substituted or unsubstituted alkyl group, alkenyl group, alkynyl group, aralkyl group, alkoxy group, and sulfide group, an aryl group, and a heterocyclic group, a substituted silyl group, a boranyl group, and a divalent substituent having a linking group, which may be identical with or different from each other;

$X_4$ represents one selected from the group consisting of substituted or unsubstituted aryl group and heterocyclic group and a divalent substituent having a linking group, which may be identical with or different from each other;

$R_4$ and $R_5$ each represent one selected from the group consisting of a hydrogen atom, a heavy hydrogen atom, a halogen atom, and substituted or unsubstituted alkyl group, aryl group, alkoxy group, and amino group, which may be identical with or different from each other;

$R_6$ represents one selected from the group consisting of a hydrogen atom, a heavy hydrogen atom, a halogen atom, and substituted or unsubstituted alkyl group, and alkoxy group, which may be identical with or different from each other; and e represents an integer of 0 to 6, and $f+g+h=6-e$, where $e+f$ equals an integer of 2 or more, and when $e=0$, at least one of $X_3$ on the anthryl group contains a substituent except a hydrogen atom, a heavy hydrogen atom, and a halogen atom).

In the organic electroluminescent device according to the present invention, a HOMO level of the first compound is higher than a HOMO level of the second compound and a LUMO level of the first compound is lower than a LUMO level of the second compound.

In the organic electroluminescent device according to the present invention, the second compound is represented by the following general formula [3]:

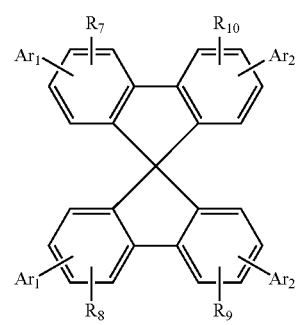

[3]

(where:

$R_7$, $R_8$, $R_9$, and $R_{10}$ each represent a hydrogen atom, a substituted or unsubstituted alkyl group, a substituted or unsubstituted aralkyl group, a substituted or unsubstituted aryl group, a substituted or unsubstituted heterocyclic group, a substituted amino group, a cyano group, or a halogen atom, where $R_7$, $R_8$, $R_9$, and $R_{10}$ may be identical with or different from each other; and $Ar_1$ and $Ar_2$ each represent a substituted or unsubstituted condensed polycyclic aromatic ring or a substituted or unsubstituted condensed polyheterocyclic group, where $Ar_1$ and $Ar_2$ may be identical with or different from each other).

In the organic electroluminescent device according to the present invention, the second compound is represented by the following general formula [4]:

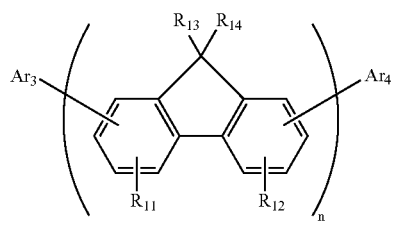

[4]

(where:

$R_{11}$ and $R_{12}$ each represent a hydrogen atom, a substituted or unsubstituted alkyl group, a substituted or unsubstituted aralkyl group, a substituted or unsubstituted aryl group, a substituted or unsubstituted heterocyclic group, a substituted amino group, a cyano group, or a halogen atom, where $R_{11}$ and $R_{12}$ may be identical with or different from each other;

$R_{13}$ and $R_{14}$ each represent a hydrogen atom, a substituted or unsubstituted alkyl group, a substituted or unsubstituted aralkyl group, a substituted or unsubstituted aryl group, or a substituted or unsubstituted heterocyclic group, where $R_{13}$ and $R_{14}$ may be identical with or different from each other;

$Ar_3$ and $Ar_4$ each represent a condensed polycyclic aromatic group substituted or unsubstituted with three or more benzene rings or a condensed polyheterocyclic group substituted or unsubstituted with three or more benzene rings, where $Ar_3$ and $Ar_4$ may be identical with or different from each other; and n represents an integer of 1 to 10.

DESCRIPTION OF THE PREFERRED EMBODIMENTS

Figure 1:
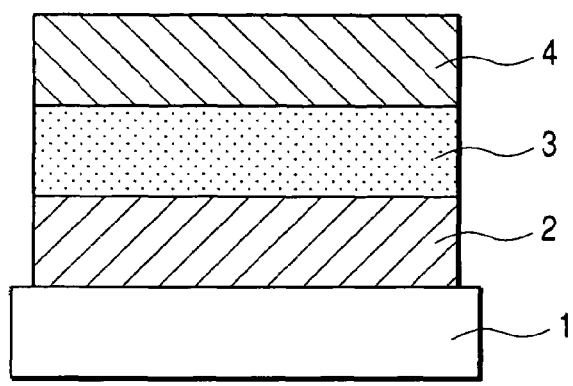
FIG. 1 is a cross-sectional diagram of an organic electroluminescent device according to an embodiment of the present invention.

Hereinafter, the present invention will be described in detail.

FIGS. 1 to 5 are schematic diagrams showing a structural example of an organic electroluminescent device of the present invention. In each figure, reference numeral 1 denotes a substrate; 2, an anode; 3, a light-emitting layer; 4, a cathode; 5, a hole-transporting layer; 6, an electron-transporting layer; 7, a hole-injection layer; and 8, a hole/exciton-blocking layer.

FIG. 1 shows an organic electroluminescent device constructed by mounting the anode 2, the light-emitting layer 3, and the cathode 4 on the substrate 1 in that order. The electroluminescent device used herein is useful in the case where the light-emitting layer has the hole-transporting ability, electron-transporting ability, and light-emitting ability by itself.

Figure 2:
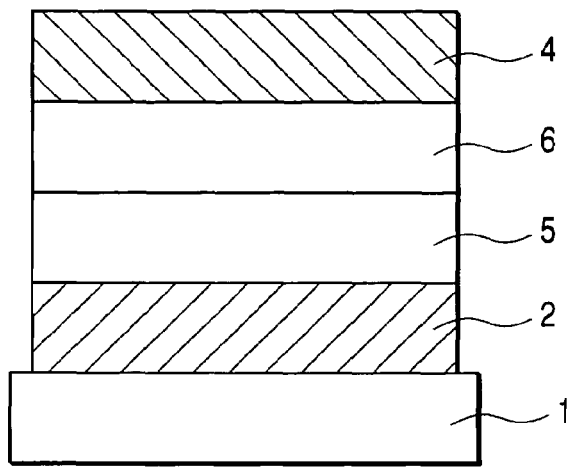
FIG. 2 is a cross-sectional diagram of an organic electroluminescent device according to an embodiment of the present invention.

FIG. 2 shows an organic electroluminescent device constructed by mounting the anode 2, the hole-transporting layer 5, the electron-transporting layer 6, and the cathode 4 on the substrate 1 in that order. In this case, a light emitting region is either the hole-transporting layer 5 or the electron-transporting layer 6. In addition, the hole- and electron-transporting functions are divided into their respective layers to increase the degree of freely selecting materials for these functions, allowing an increase in performance of the device.

Figure 3:
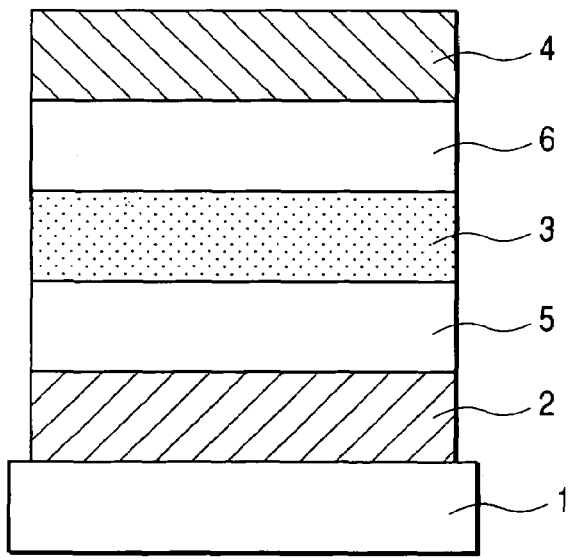
FIG. 3 is a cross-sectional diagram of an organic electroluminescent device according to an embodiment of the present invention.

FIG. 3 shows an organic electroluminescent device constructed by mounting the anode 2, the hole-transporting layer 5, the light-emitting layer 3, the electron-transporting layer 6, and the cathode 4 on the substrate 1 in that order. In this case, the carrier-transporting and light-emitting functions are separated from each other. The device is used in combination with the compounds having the hole-transporting ability, electron-transporting ability, and light-emitting ability as appropriate, allowing a substantial increase in flexibility for material choice. Simultaneously, various kinds of compounds having different emission wavelengths can be used, allowing an increase in variety of light emission. Furthermore, effectively confining each carrier or exciton in the middle light-emitting layer 3 will allow an increase in light-emitting efficiency.

Figure 4:
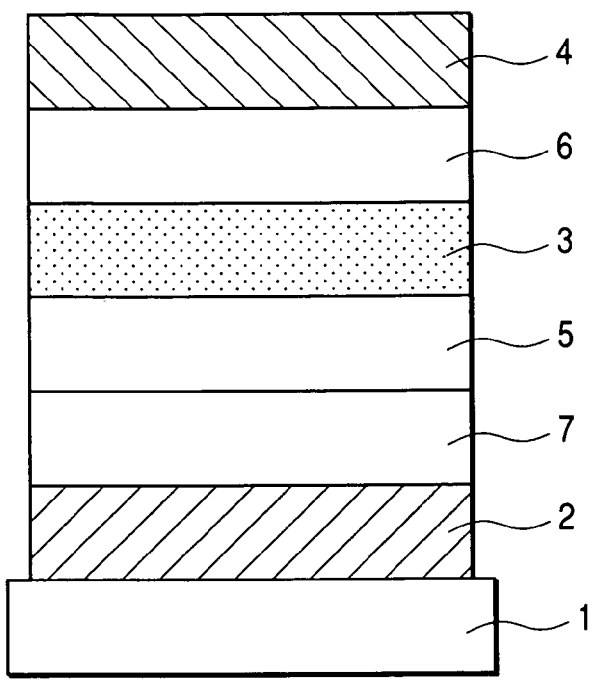
FIG. 4 is a cross-sectional diagram of an organic electroluminescent device according to an embodiment of the present invention.

FIG. 4 is different from FIG. 3 in that the hole-injection layer 7 is inserted in the layer structure on the anode 2 side. The insertion is effective in improving the close contact between the anode 2 and the hole-transporting layer 5 or improving the hole-injecting ability. Therefore, such a configuration of the device will be advantageous in lowering the voltage of the device.

Figure 5:
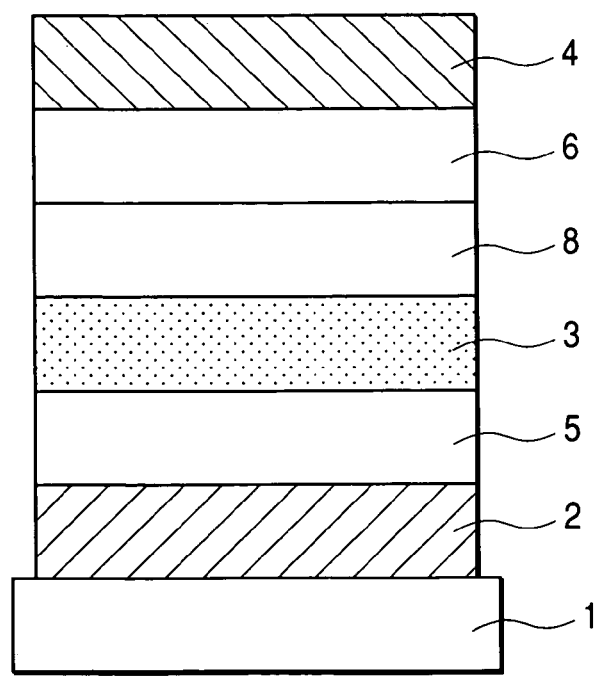
FIG. 5 is a cross-sectional diagram of an organic electroluminescent device according to an embodiment of the present invention.

FIG. 5 is different from FIG. 3 in that a layer for preventing a hole or exciton from traveling to the cathode 4 (a hole/exciton-blocking layer 8) is inserted between the light-emitting layer 3 and the electron-transporting layer 6. Using a compound having a large ionization potential as the hole/exciton-blocking layer 9 efficiently provides the configuration of the device with improved light-emitting efficiency.

The present invention is characterized in that the light-emitting region in the device configuration contains a first compound represented by the formula [1] and a second compound having a band gap wider than that of the first compound and light emitted from the first compound is mainly utilized.

In particular, it is desirable to choose each compound such that absorption wavelengths for the first compound and light-emission wavelengths of the second compound overlap. Such choice facilitates energy transfer from the second compound to the first compound having high light-emitting efficiency, allowing an increase in light-emitting efficiency of the device.

On the other hand, when the band gap of the second compound is narrower than that of the first compound, the luminescence of the first compound having high efficiency cannot be used effectively.

In addition, comparing with the case of using the first compound alone, the advantages of using both the first and second compounds together include:

(1) an inhibition of concentration quenching by the association of the first compound;

(2) facilitation of film formation by the mixing of the second compound; and (3) facilitation of finding a carrier balance between electrons and holes using two kinds of the compounds.

Therefore, high light-emitting efficiency and longer life can be obtained. For obtaining the above effects, the concentration of the first compound in the light-emitting region is preferably in the range of 0.01% to 80%, particularly in the range of 1 to 40% for obtaining the above advantages (1) to (3) in a balanced manner.

The concentration of the compounds to be mixed may be uniform or gradually changed in the light-emitting region.

For enhancing the effects described above, a third compound may be added. In this case, it is also important to select as the third compound a compound having a band gap wider than that of the first compound. The band gap may be calculated by determining spectra ranging from ultraviolet through visible light.

The first compound represented by the general formula [1] or [2] is characterized in that at least two anthryl groups are provided as a light-emitting unit on an aromatic ring, a condensed polycyclic ring, or a heterocyclic ring core and each of the anthryl groups has a substituent such as an amino group, an amino group with a linking group, or an aryl group. Luminescence with high efficiency can be obtained. Furthermore, in particular, light-emission color can be adjusted from blue to green, or to light-emission colors at longer wavelengths by changing the anthryl groups or substituents such as an amino group.

The introduction of a substituted amino group is expected to increase the hole-transporting ability. The substitution with an amino group on the anthryl group allows higher Tg (e.g., Tg=215° C. for Exemplified Compound 34 shown below), so that a material having good film-forming ability and thermal stability can be obtained when it adopts a star-burst type dendritic molecular shape.

Specific examples of the linking group, substituent, and molecular unit A in the above general formulae [1] and [2] will be described below.

Examples of the linking group in the above general formulae [1] and [2] include, but are not limited to, substituted or unsubstituted arylene group and divalent heterocyclic group.

Examples of a divalent substituent having a linking group in the above general formulae [1] and [2] include, but are not limited to: substituted or unsubstituted alkylene group, alkenylene group, alkynylene group, aralkylene group, and amino group; and a substituted silyl group, ether group, thioether group, and carbonyl group.

Examples of a substituted or unsubstituted alkyl group include, but are not limited to, a methyl group, a methyl-d1 group, a methyl-d3 group, an ethyl group, an ethyl-d5 group, an n-propyl group, an n-butyl group, an n-pentyl group, an n-hexyl group, an n-heptyl group, an n-octyl group, an n-decyl group, an iso-propyl group, an iso-propyl-d7 group, an iso-butyl group, a sec-butyl group, a tert-butyl group, a tert-butyl-d9 group, an iso-pentyl group, a neopentyl group, a tert-octyl group, a fluoromethyl group, a difluoromethyl group, a trifluoromethyl group, a 2-fluoroethyl group, a 2,2,2-trifluoroethyl group, a perfluoroethyl group, a 3-fluoropropyl group, a perfluoropropyl group, a 4-fluorobutyl group, a perfluorobutyl group, a 5-fluoropentyl group, a 6-fluorohexyl group, a chloromethyl group, a trichloromethyl group, 2-chloroethyl group, a 2,2,2-trichloroethyl group, a 4-chlorobutyl group, a 5-chloropentyl group, a 6-chlorohexyl group, a bromomethyl group, a 2-bromoethyl group, an iodomethyl group, a 2-iodethyl group, a hydroxymethyl group, a hydroxyethyl group, a cyclopropyl group, a cyclobutyl group, a cyclopentyl group, a cyclohexyl group, a cyclopentylmethyl group, a cyclohexylmethyl group, a cyclohexylethyl group, a 4-fluorocyclohexyl group, a norbornyl group, and an adamantyl group.

Examples of a substituted or unsubstituted aralkyl group include, but are not limited to, a benzyl group, a 2-phenylethyl group, a 2-phenylisopropyl group, a 1-naphthylmethyl group, a 2-naphthylmethyl group, a 2-(1-naphthyl)ethyl group, a 2-(2-naphthyl)ethyl group, a 9-anthrylmethyl group, a 2-(9-anthryl)ethyl group, a 2-fluorobenzyl group, a 3-fluorobenzyl group, a 4-fluorobenzyl group, a 2-chlorobenzyl group, a 3-chlorobenzyl group, a 4-chlorobenzyl group, a 2-bromobenzyl group, a 3-bromobenzyl group, and a 4-bromobenzyl group.

Examples of a substituted or unsubstituted alkenyl group include, but are not limited to, a vinyl group, an allyl group (2-propenyl group), a 1-propenyl group, an iso-propenyl group, a 1-butenyl group, a 2-butenyl group, a 3-butenyl group, and a styryl group.

Examples of a substituted or unsubstituted alkynyl group include, but are not limited to, an acetylenyl group, a phenylacetylenyl group, and a 1-propynyl group.

Examples of a substituted or unsubstituted aryl group include, but are not limited to, a phenyl group, a phenyl-d5 group, a 4-methylphenyl group, a 4-methoxyphenyl group, a 4-ethylphenyl group, a 4-fluorophenyl group, a 4-trifluorophenyl group, a 3,5-dimethylphenyl group, a 2,6-diethylphenyl group, a mesityl group, a 4-tert-butylphenyl group, a ditolylaminophenyl group, a biphenyl group, a terphenyl group, a 1-naphthyl group, a 2-naphthyl group, a 1-naphthyl-d7 group, a 2-naphthyl-d7 group, a 1-anthryl group, a 2-anthryl group, a 9-anthryl group, a 9-anthryl-d9 group, a 2-phenanthryl group, a 3-phenanthryl group, a 4-phenanthryl group, a 9-phenanthryl group, a 9-phenanthryl-d9 group, a 1-pyrenyl group, a 1-pyrenyl-d9 group, a 2-pyrenyl group, a 4-pyrenyl group, a tetracenyl group, a pentacenyl group, a fluorenyl group, a triphenylenyl group, and a perylenyl group.

Examples of a substituted or unsubstituted heterocyclic group include, but are not limited to, a pyrrolyl group, a pyridyl group, a pyridyl-d5 group, a bipyridyl group, a methylpyridyl group, a terpyrrolyl group, a thienyl group, a thienyl-d4 group, a terthienyl group, a propylthienyl group, a furyl group, a furyl-d4 group, an indolyl group, a 1,10-phenanthroline group, a phenazinyl group, a quinolyl group, a carbazolyl group, an oxazolyl group, an oxadiazolyl group, a thiazolyl group, and a thiadiazolyl group.

Examples of a substituted or unsubstituted alkylene group include, but are not limited to, a methylene group, a methylene-d2 group, a difluoromethylene group, an ethylene group, an ethylene-d4 group, a perfluoroethylene group, a propylene group, an iso-propylene group, a butylene group, and a 2,2-dimethylpropylene group.

Examples of a substituted or unsubstituted aralkylene group include, but are not limited to, a benzylene group, a 2-phenylethylene group, a 2-phenylisopropylene group, a 1-naphthylmethylene group, a 2-naphthylmethylene group, a 9-anthrylmethylene group, a 2-fluorobenzylene group, a 3-fluorobenzylene group, a 4-fluorobenzylene group, a 4-chlorobenzyl group, and a 4-bromobenzylene group.

Examples of a substituted or unsubstituted alkenyl group include, but are not limited to, a vinylene group, an iso-propenyl group, a styrylene group, and a 1,2-diphenylvinylene group.

Examples of a substituted or unsubstituted alkynyl group include, but are not limited to, an acetylenylene group and a phenylacetylenylene group.

Examples of a substituted or unsubstituted arylene group include, but are not limited to, a phenylene group, a biphenylene group, a tetrafluorophenylene group, a dimethylphenylene group, a naphthylene group, an anthrylene group, a phenanthrylene group, a pyrenylene group, a tetracenylene group, a pentacenylene group, and a perylenylene group.

Examples of a substituted or unsubstituted divalent heterocyclic group include, but are not limited to, furylene group, a pyrrorylene group, a pyridilene group, a terpyridilene group, a thienylene group, a terthienylene group, an oxazolylene group, a thiazolylene group, and a carbazolylene group.

In a substituted or unsubstituted amino(—NR'R") group, each of R' and R" is represented by a hydrogen atom, a heavy hydrogen atom, the above substituted or unsubstituted alkyl group, aralkyl group, aryl group, or heterocyclic group, an alkylene group, alkenylene group, alkynylene group or aralkylene group having a linking group derived from a substituted or unsubstituted arylene group or divalent heterocyclic group, or an amino group, substituted silyl group, ether group, thioether group, and carbonyl group. Specific examples thereof include, but are not limited to, an amino group, an N-methylamino group, an N-ethylamino group, an N,N-dimethylamino group, an N,N-diethylamino group, an N-methyl-N-ethylamino group, an N-benzylamino group, an N-methyl-N-benzylamino group, an N,N-dibenzylamino group, an anilino group, an N,N-diphenylamino group, an N-phenyl-N-tolylamino group, an N,N-ditolylamino group, an N-methyl-N-phenylamino group, an N,N-dianisolylamino group, an N-mesityl-N-phenylamino group, an N,N-dimesitylamino group, an N-phenyl-N-(4-tert-butylphenyl)amino group, and an N-phenyl-N-(4-trifluoromethylphenyl)amino group.

Examples of a substituted or unsubstituted alkoxy group include: an alkyloxy group and aralkyloxy group having the above substituted or unsubstituted alkyl group or aralkyl group; and an aryloxy group having the above substituted or unsubstituted aryl group or heterocyclic group. Specific examples thereof include, but are not limited to, a methoxy group, an ethoxy group, a propoxy group, a 2-ethyl-octyloxy group, a phenoxy group, a 4-tert-butylphenoxy group, a benzyloxy group, and a thienyloxy group.

Examples of a substituted or unsubstituted sulfide group include: an alkylsulfide group or aralkylsulfide group having the above substituted or unsubstituted alkyl group or aralkyl group; and an arylsulfide group having the above substituted or unsubstituted aryl group or heterocyclic group. Specific examples thereof include, but are not limited to, a methylsulfide group, an ethylsulfide group, a phenylsulfide group, and a 4-methylphenylsulfide group.

Examples of a molecular unit A include, but are not limited to: a heavy hydrogen-containing substituted or unsubstituted benzene ring, biphenyl ring, terphenyl ring, naphthalene ring, phenanthrene ring, anthracene ring, tetracene ring, benzanthracene ring, chrysene ring, pyrene ring, perylene ring, corranulen ring, triphenylene ring, thiophene ring, pyridine ring, pyrazine ring, pyrazole ring, pyrrole ring, terthiophene ring, terpyridine ring, terpyrrole ring, triazine ring, carbazole ring, benzoimidazole ring, benzothiazole ring, quinoline ring, quinoxaline ring, quinazoline ring, phthalazine ring, diphenylmethane ring, tetraphenylsilane, tetraphenylgermane, and tetraphenylmethane.

Examples of substituents which the above substituents, linking groups and molecular units A may have include, but are not limited to: a heavy hydrogen atom; alkyl groups such as a methyl group, an ethyl group, an n-propyl group, an n-butyl group, an n-pentyl group, an n-hexyl group, an n-heptyl group, an n-octyl group, an n-decyl group, an iso-propyl group, an iso-butyl group, a sec-butyl group, a tert-butyl group, an iso-pentyl group, a neopentyl group, a tert-octyl group, a benzyl group, and a 2-phenylethyl group; an aralkyl group; alkoxy groups such as a methoxy group, an ethoxy group, a propoxy group, a 2-ethyl-octyloxy group, a phenoxy group, a 4-tert-butylphenoxy group, and a benzyloxy group; aryl groups such as a phenyl group, a 4-methylphenyl group, a 4-ethylphenyl group, a 3-chlorophenyl group, a 3,5-dimethylphenyl group, a triphenylamino group, a biphenyl group, a terphenyl group, a naphthyl group, an anthryl group, a phenanthryl group, and a pyrenyl group; heterocyclic groups such as a pyridyl group, a bipyridyl group, a methylpyridyl group, a thienyl group, a terthienyl group, a propylthienyl group, a furyl group, a quinolyl group, a carbazolyl group, and an N-ethylcarbazolyl group; halogen groups; a hydroxyl group; a cyano group; and a nitro group.

Typical examples of the compounds represented by the general formulae [1] and [2] will be given below.

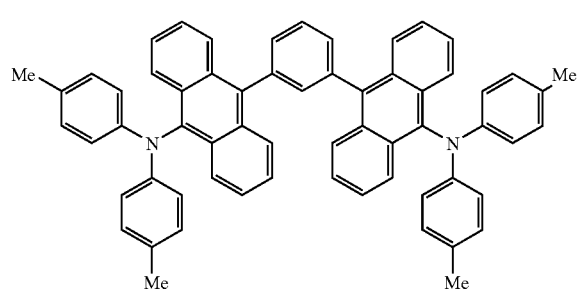

1

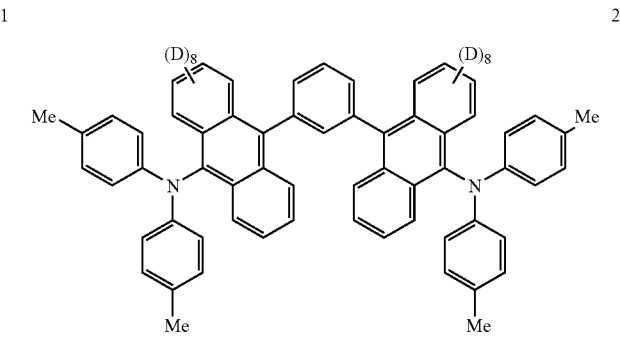

2

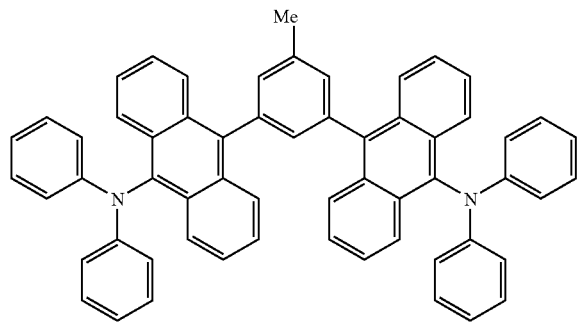

3

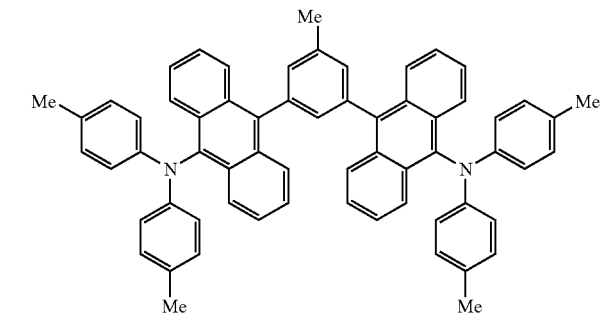

4

-continued
5
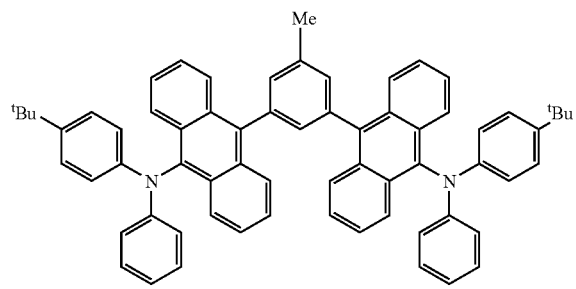
6
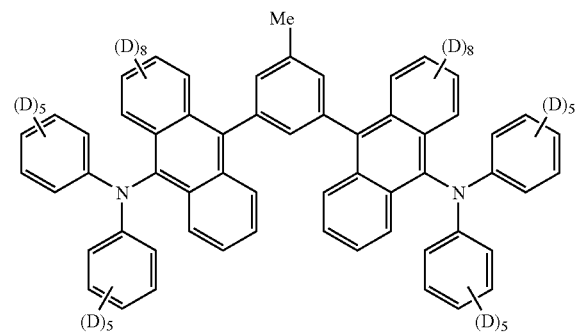
7
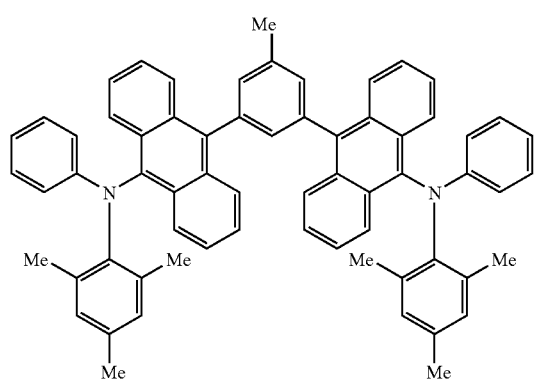
8
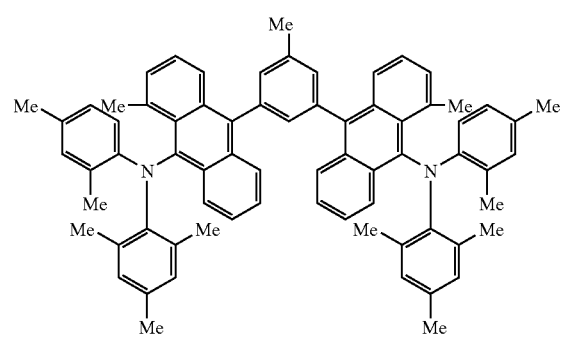
9
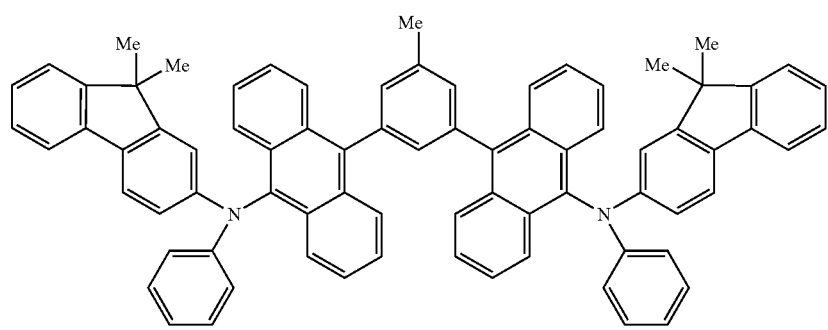
10
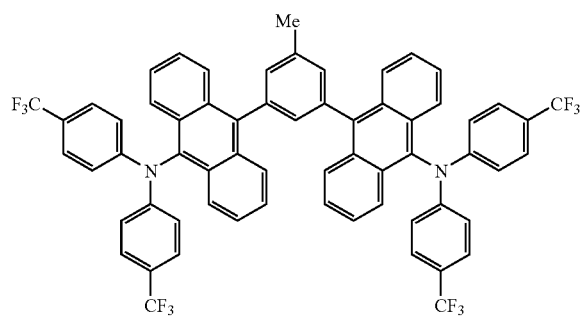
11
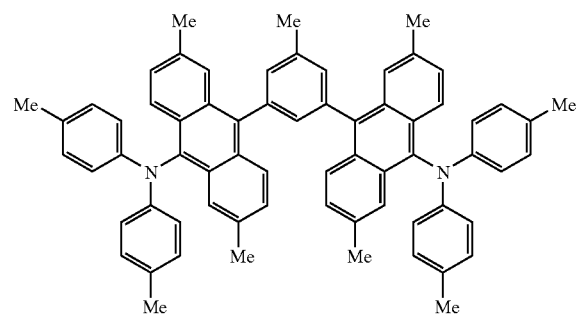

-continued
12
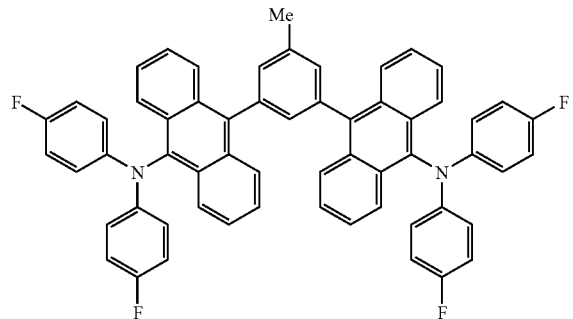
13
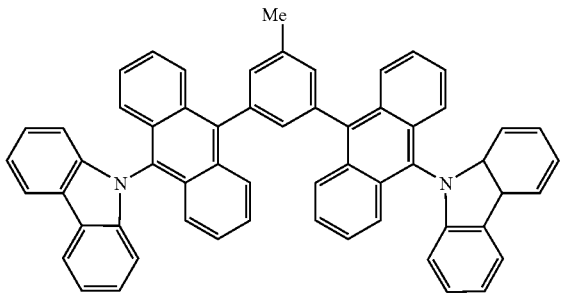
14
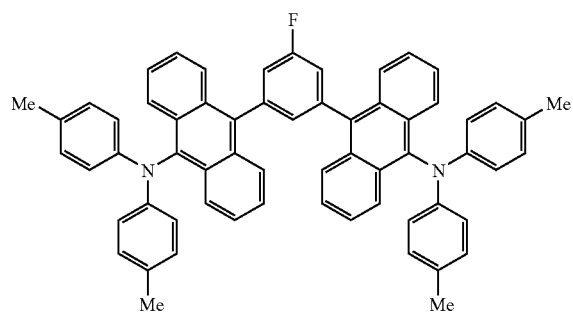
15
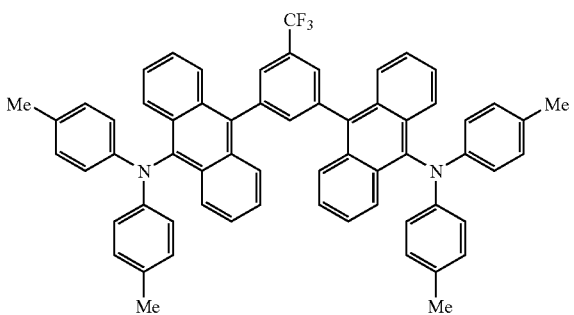
16
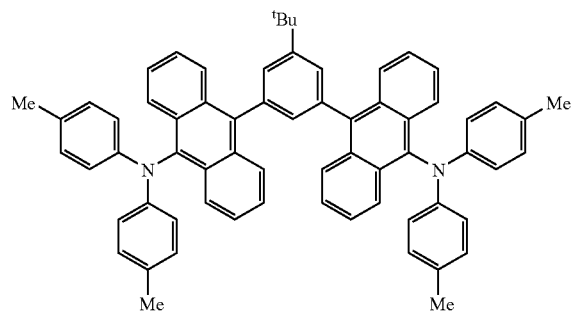
17
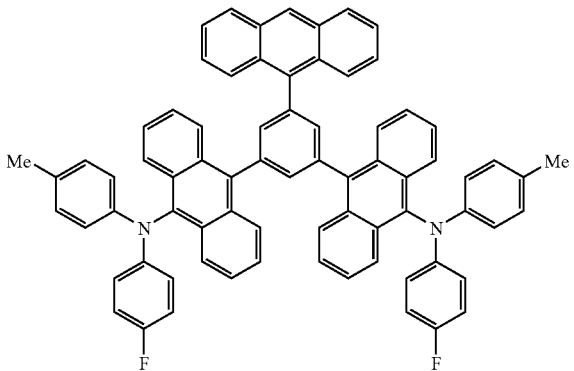
18
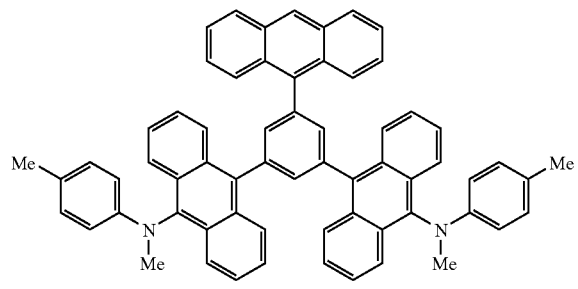
19
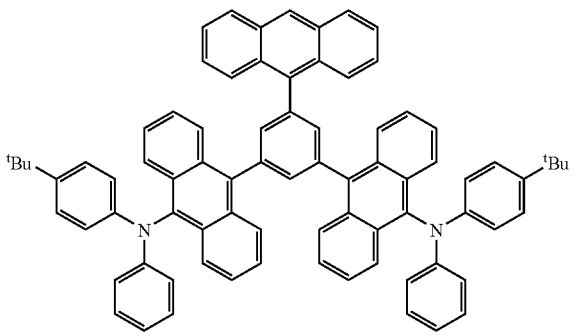

-continued
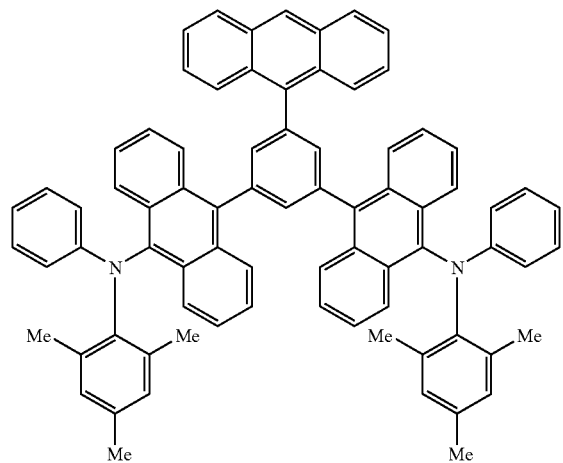
20
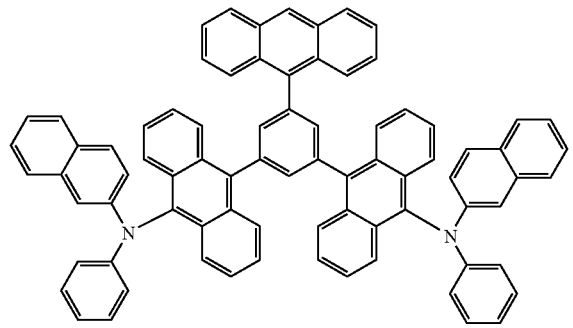
21
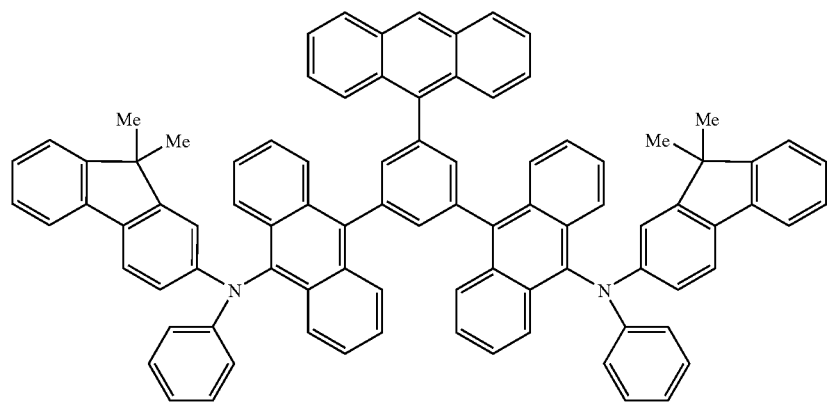
22
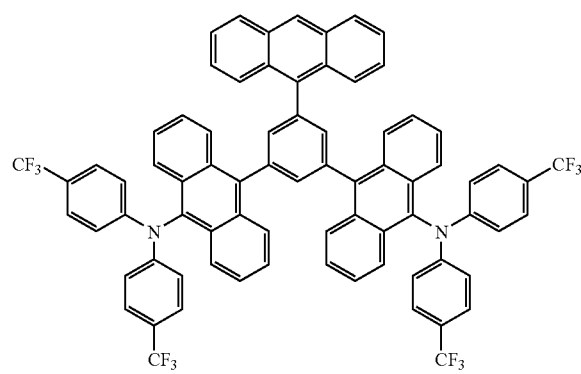
23
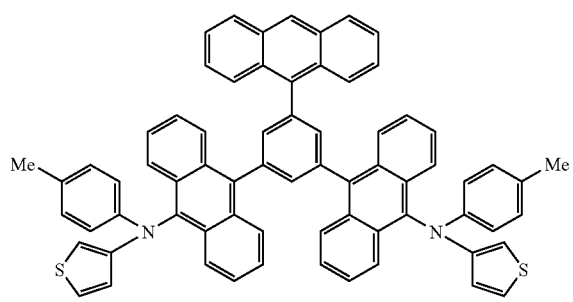
24

-continued
25
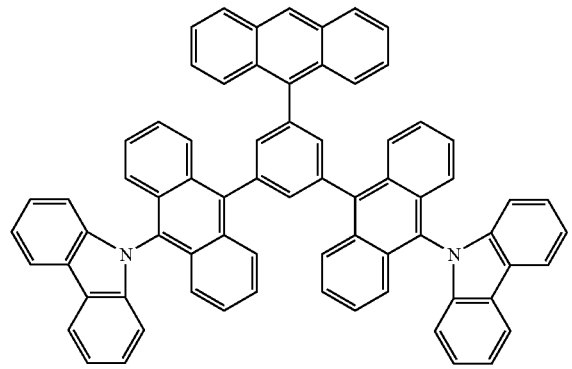
26
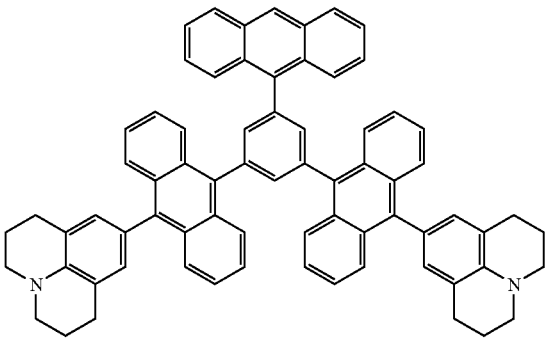
27
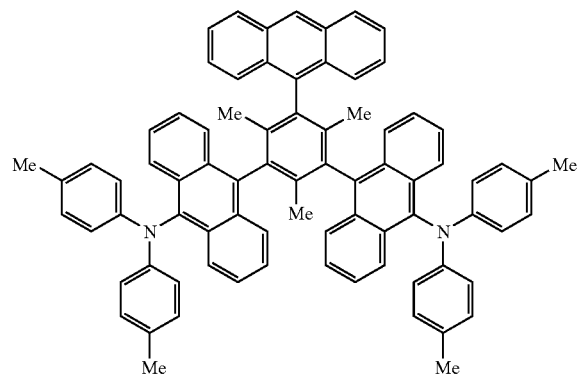
28
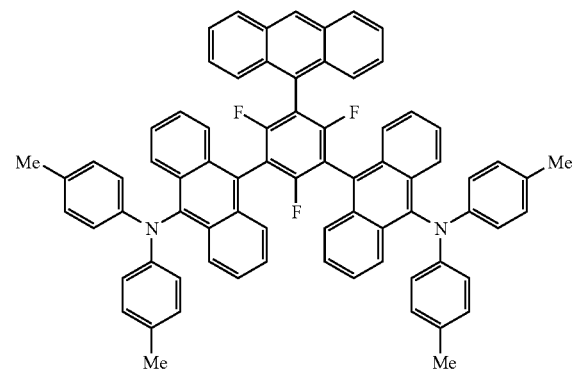
29
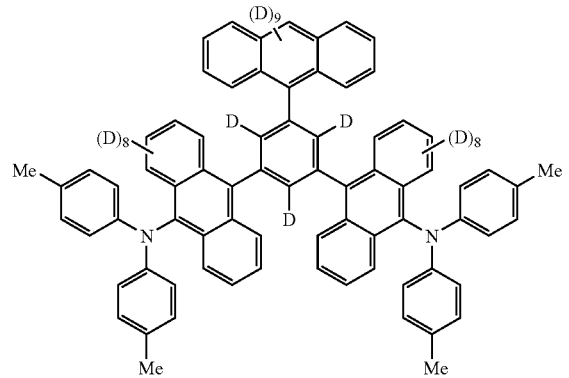
30
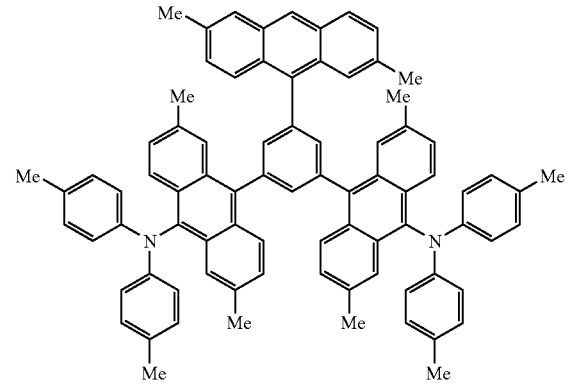
31
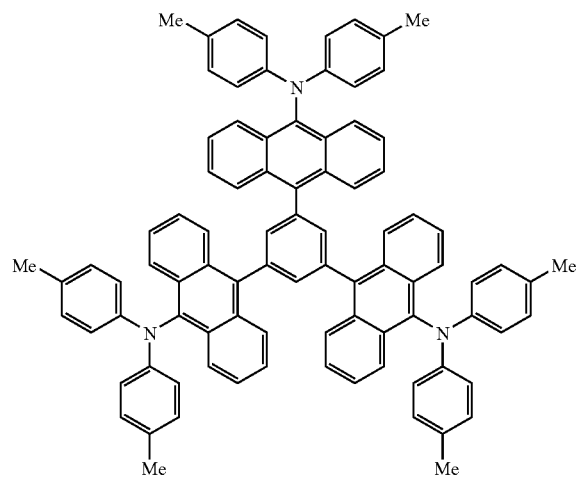

-continued
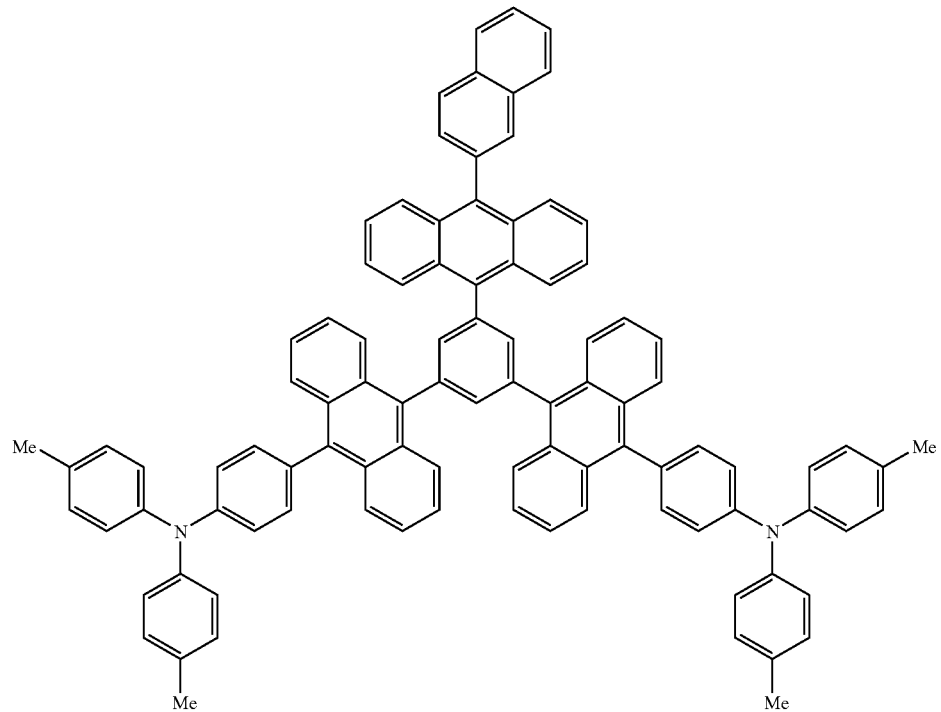
32
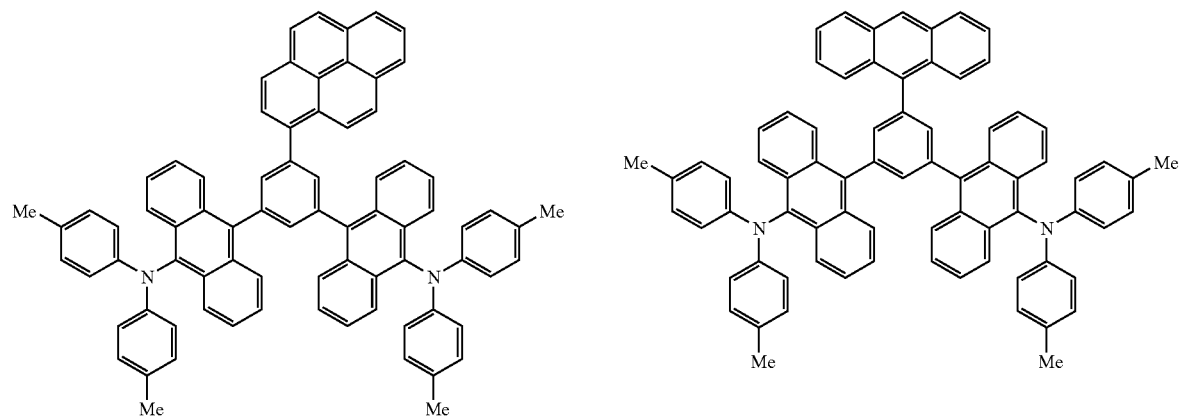
33    34
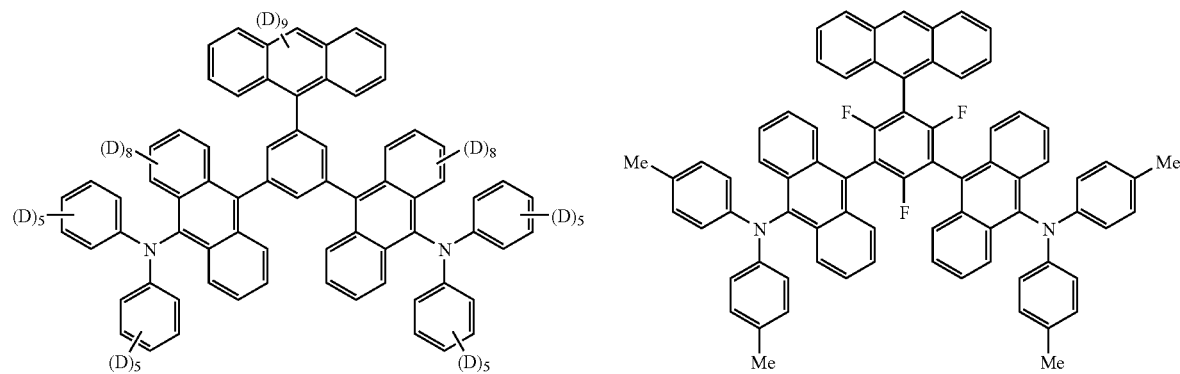
35    36

-continued
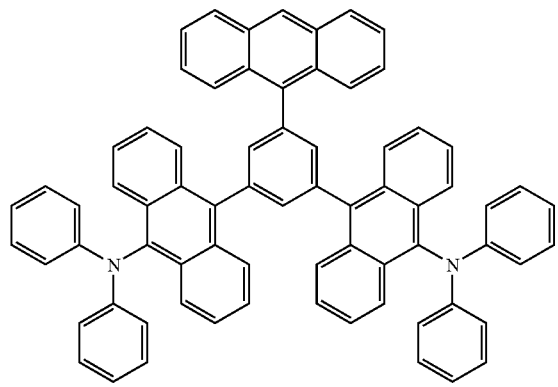
37
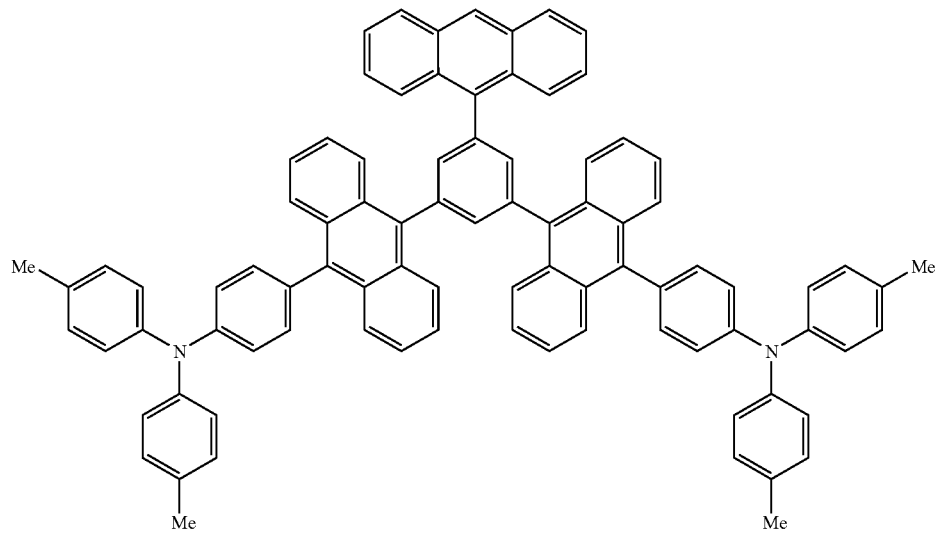
38
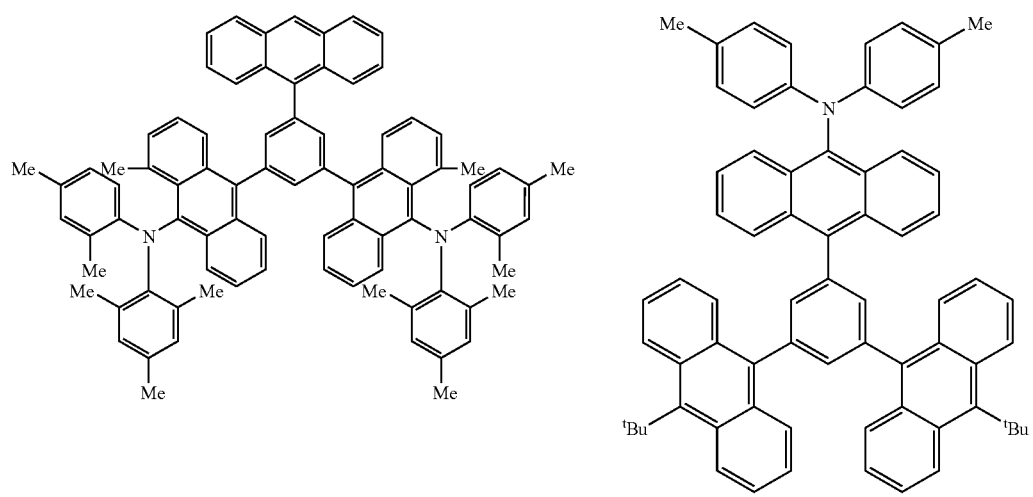
39 40

-continued
41
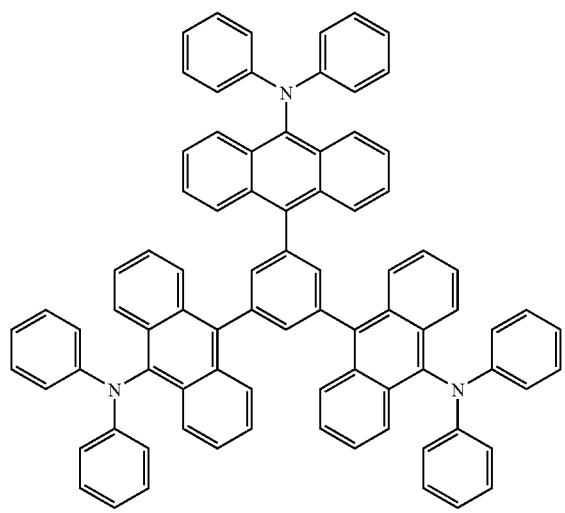
42
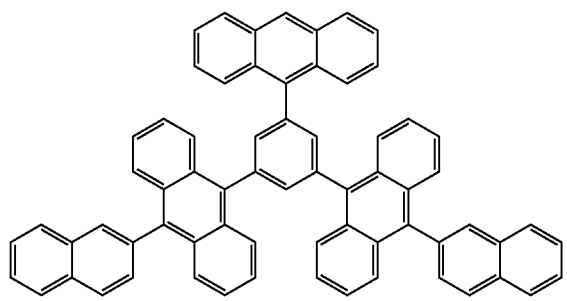
43
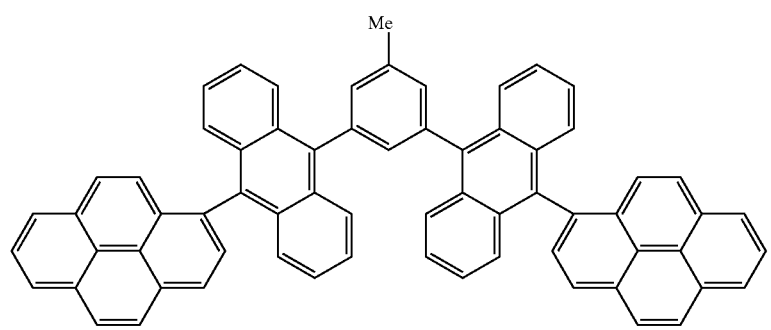
44
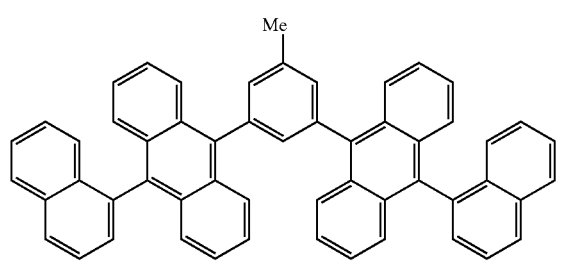
45
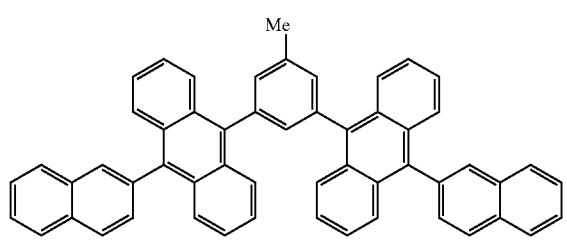
46
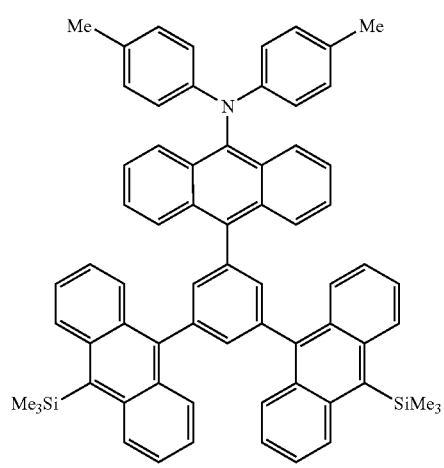

47
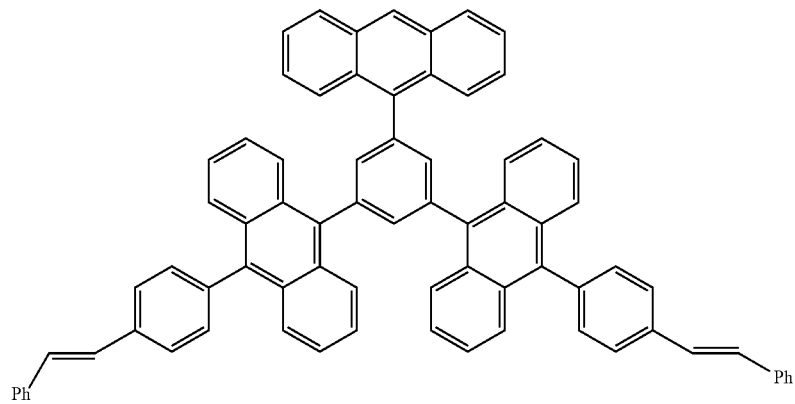
48
49
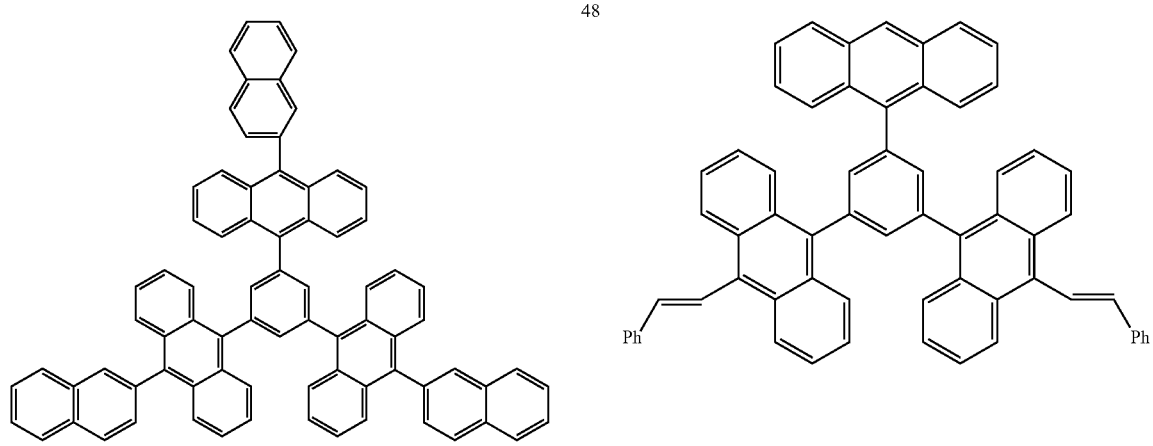
50
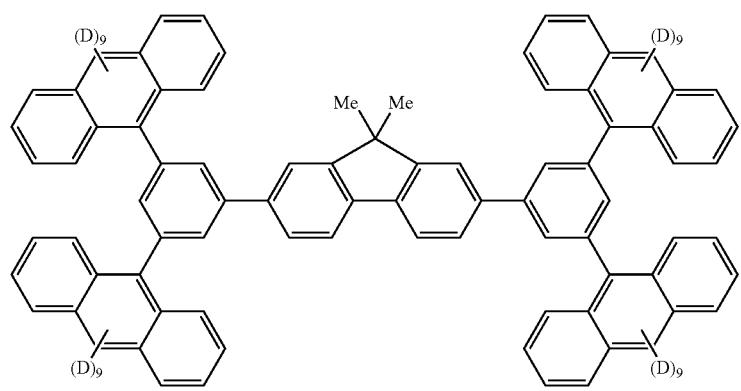

-continued
51
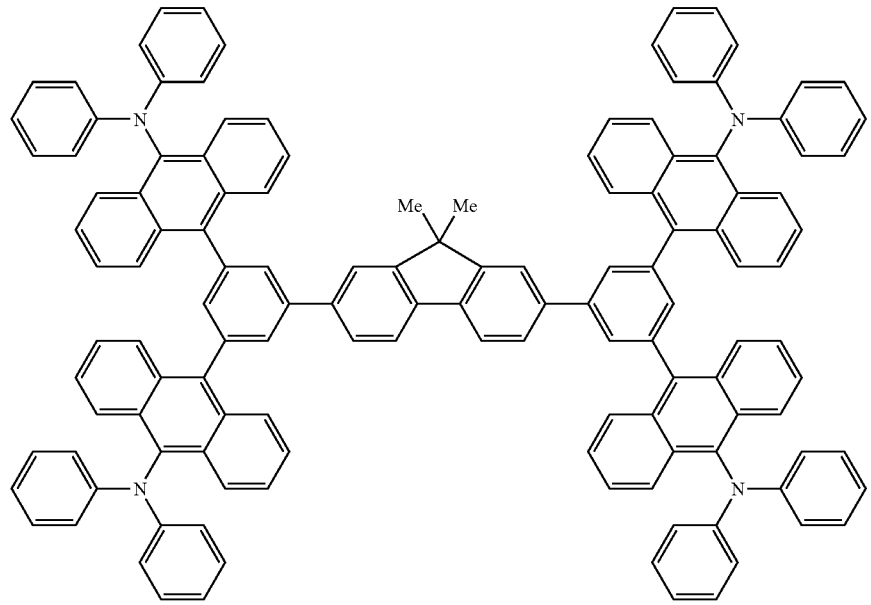
52
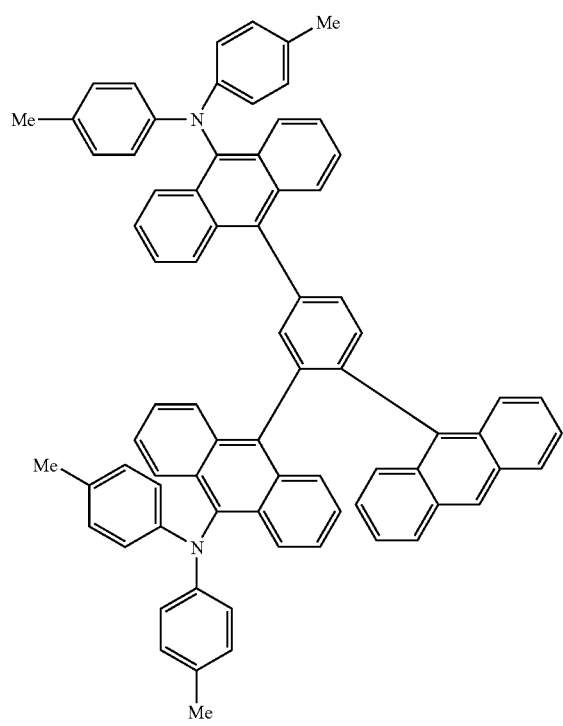
53
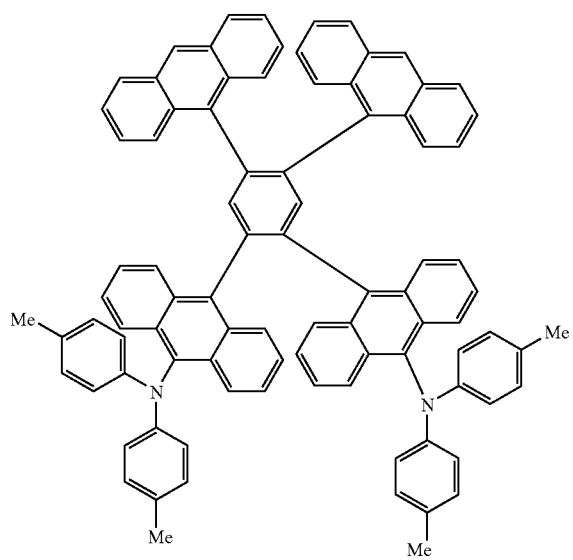

54
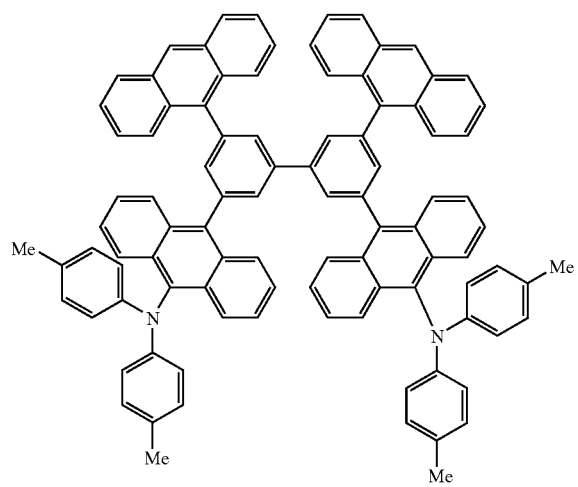
55
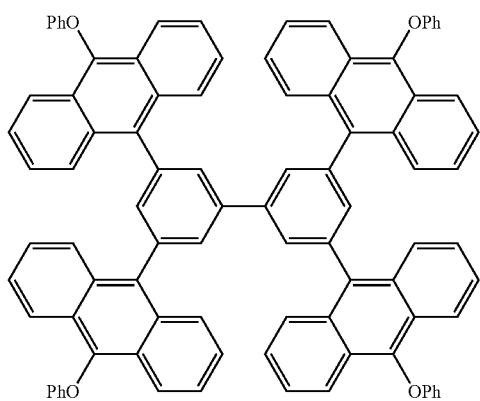
56
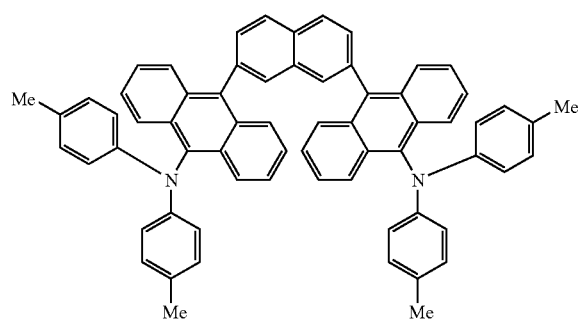
57
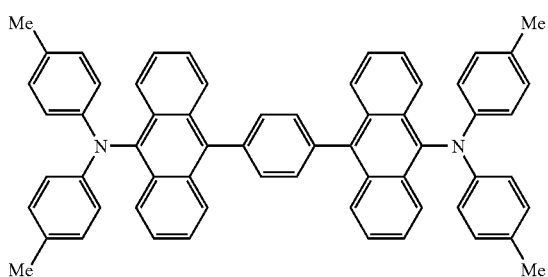
58
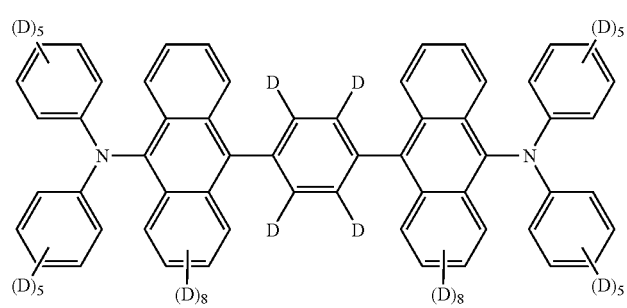
59
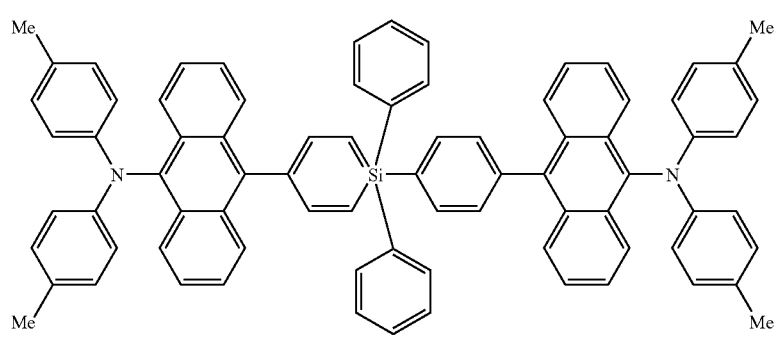

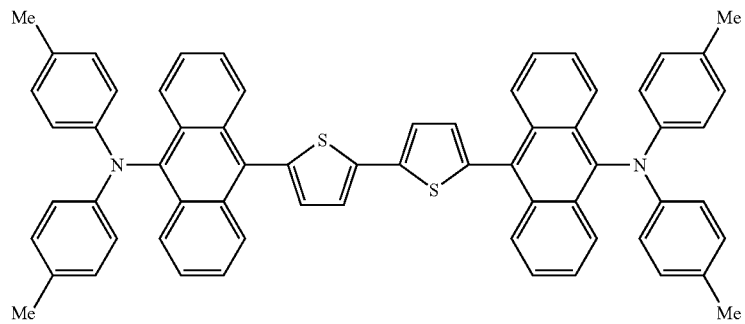

60

Figure 6:
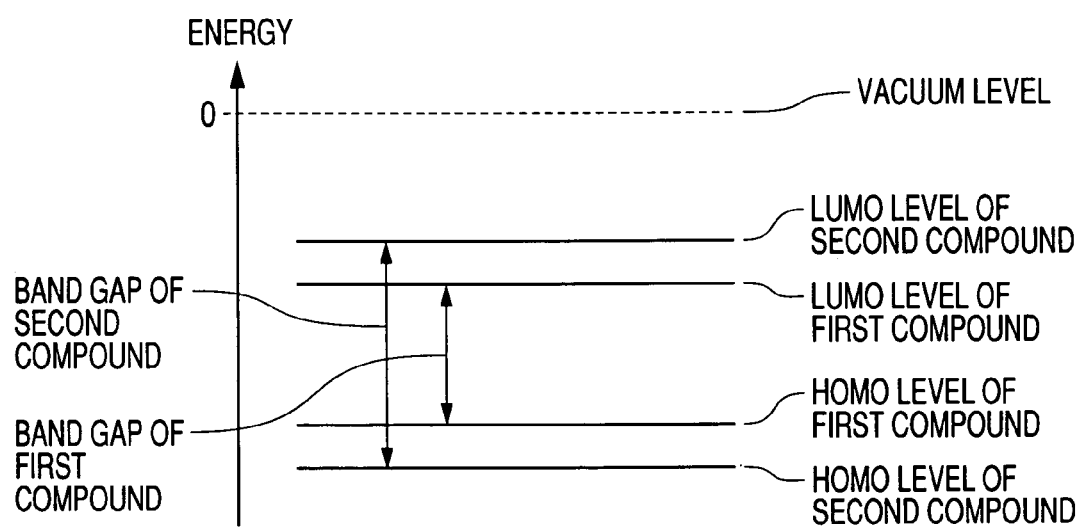
FIG. 6 is an explanatory diagram of a preferred relationship between a HOMO/LUMO level of a first compound and a HOMO/LUMO level of a second compound in a light-emitting region of the organic electroluminescent device according to the present invention.

Furthermore, as shown in FIG. 6, it is preferable to select compounds such that the HOMO level of the first compound is higher than that of the second compound and also the LUMO level of the first compound is lower than that of the second compound.

Such selection allows an increase in probability of direct re-association between an electron and a hole on the first compound, permitting an increase in light-emitting efficiency of the device.

The HOMO levels of the first and second light-emitting compounds can be determined by, for example, ultraviolet photoelectron spectroscopy (UPS), another electron spectroscopy (e.g., a measuring instrument named AC-1 manufactured by Riken Kiki Co., Ltd.), or measurement of an oxidation potential with a cyclic voltammetry method. In addition, the LUMO levels of these compounds can be determined by a method by which a LUMO level is calculated from the band gap measured value with the absorption of light and the above HOMO level, or from measurement of reduction potential with a cyclic voltammetry method. Furthermore, it is also possible to predict the HOMO and LUMO levels by simulated calculation such as a molecular orbital method or a density functional theory.

The second compound is preferably one represented by the general formula [3] or [4]. Any compound represented by the general formula [3] or [4] has an inflexible bulky unit in the center thereof and a condensed polycyclic aromatic group or condensed polyheterocyclic group excellent in charge-transporting or light-emitting characteristic. The second compound is excellent in stability over time while crystallization or the like hardly occurs, allowing light emission with high efficiency.

Typical examples of the compounds represented by the general formula [3] will be given below.

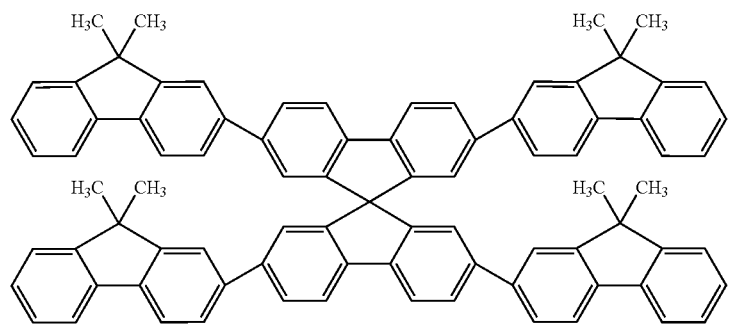

101

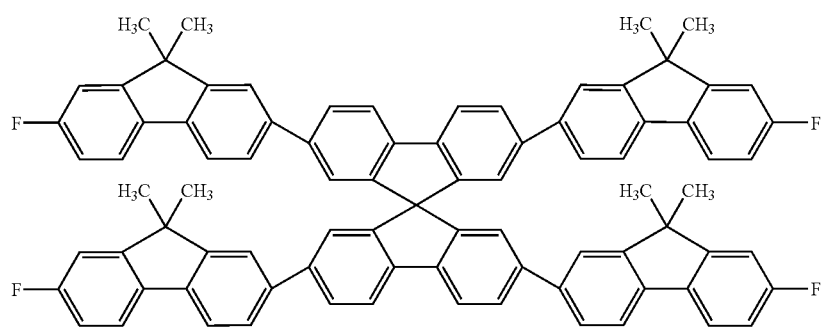

102

-continued
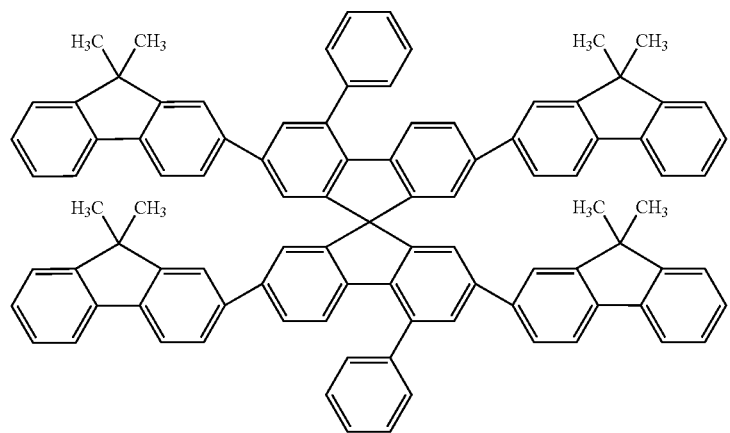
103
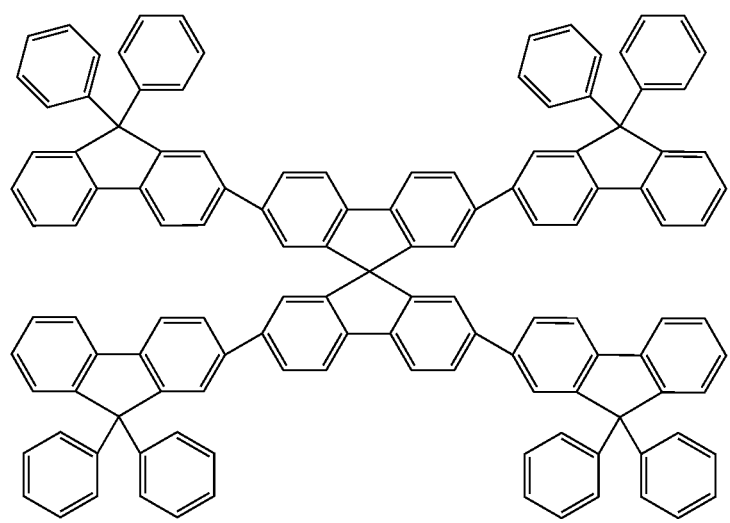
104
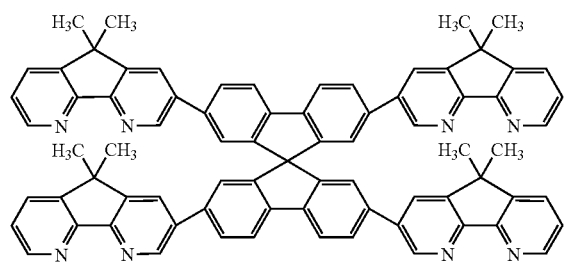
105
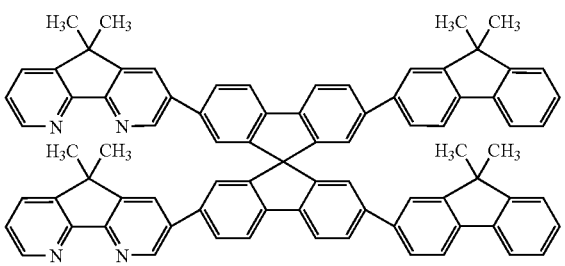
106

-continued
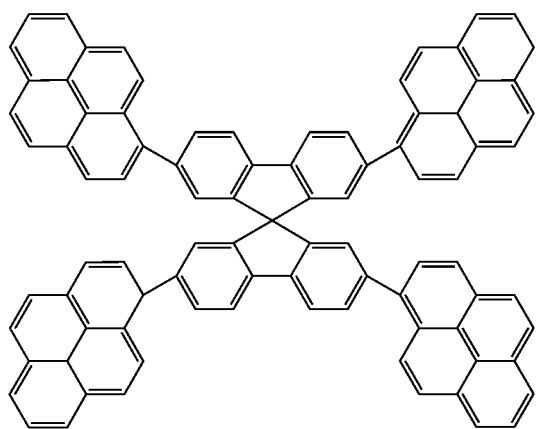
107
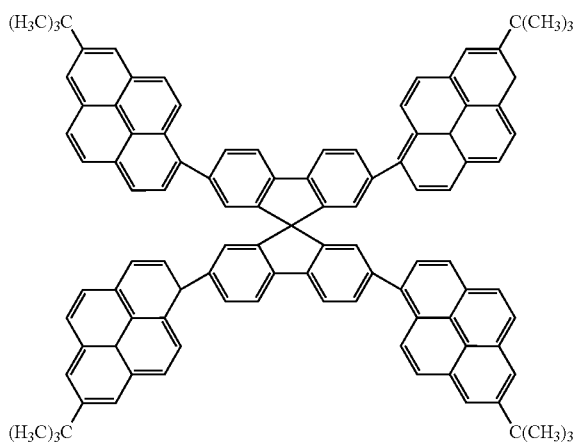
108
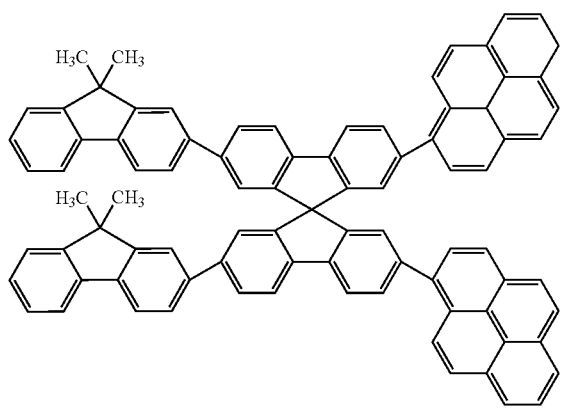
109
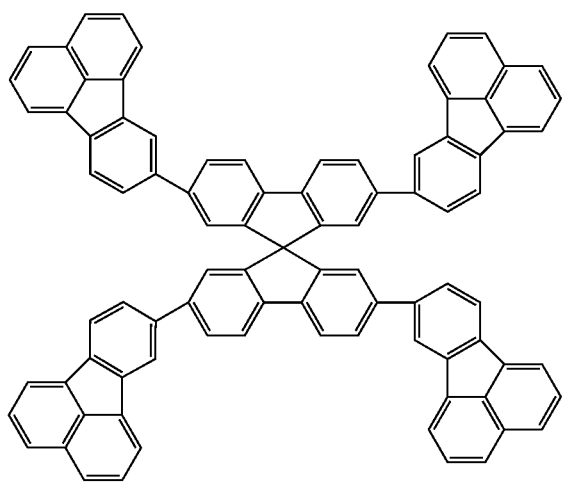
110
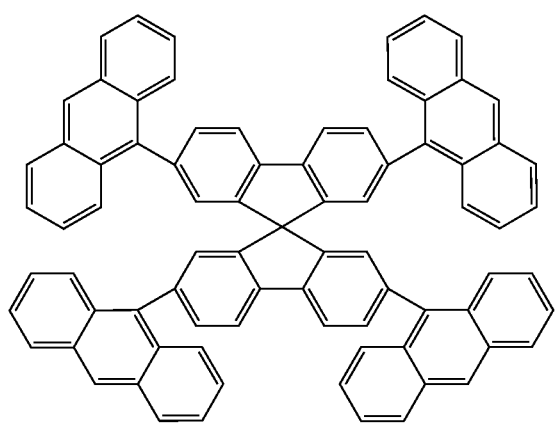
111
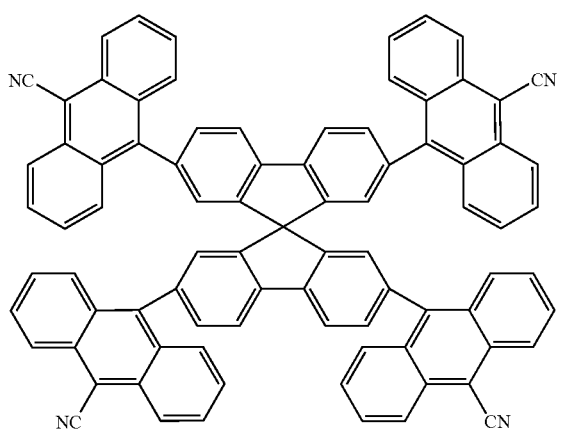
112

-continued
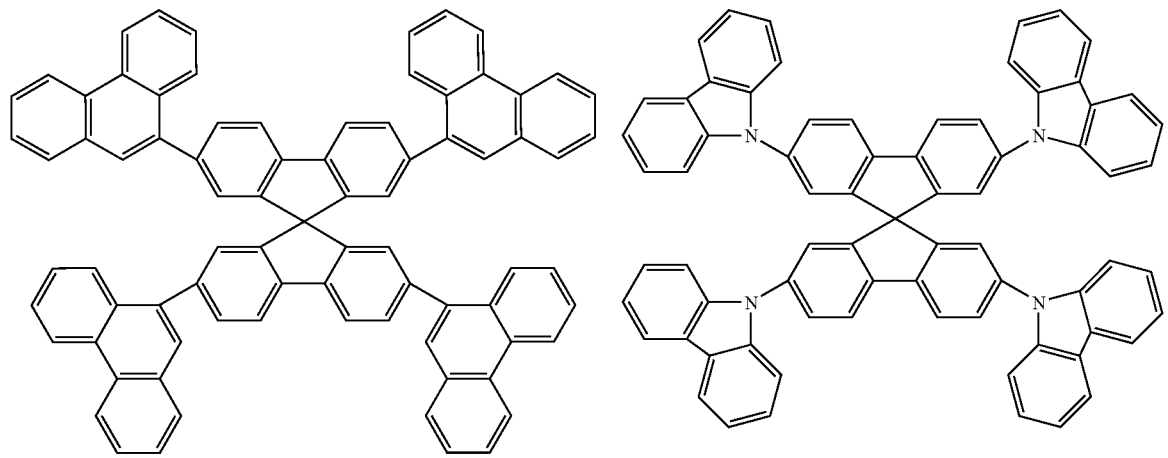
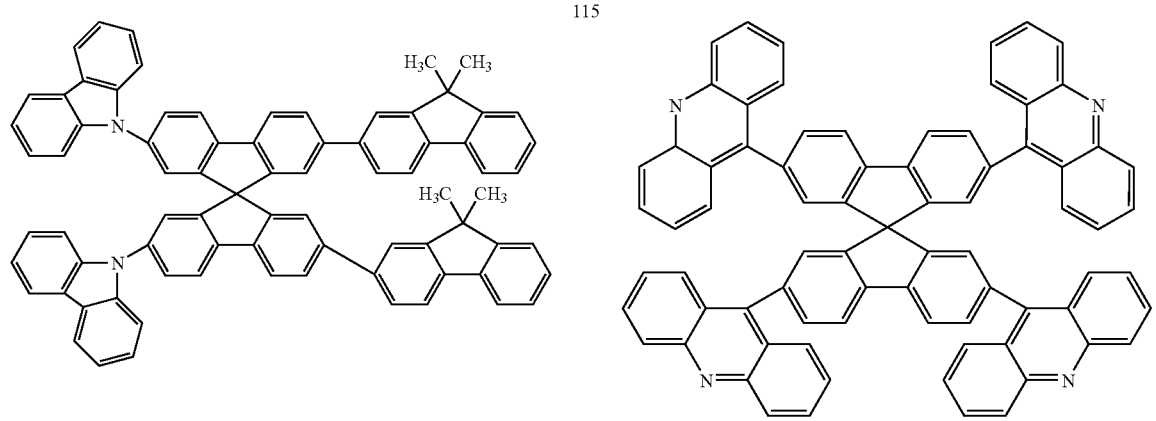
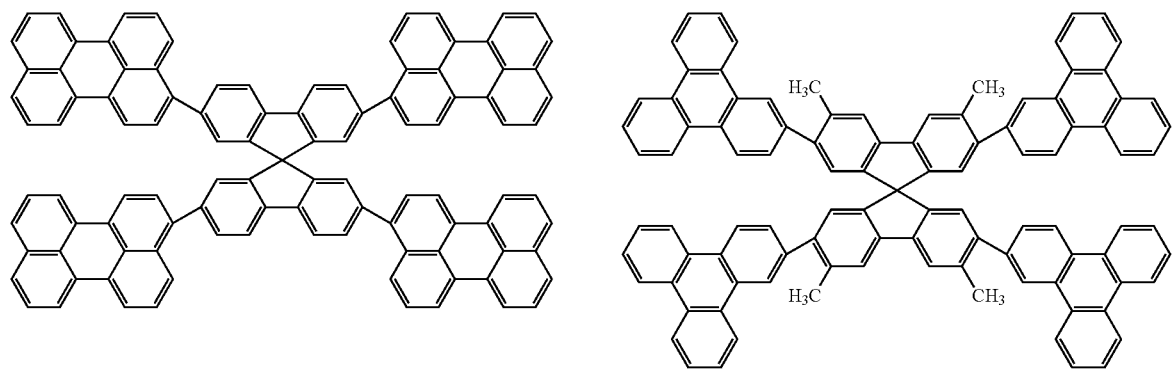

-continued
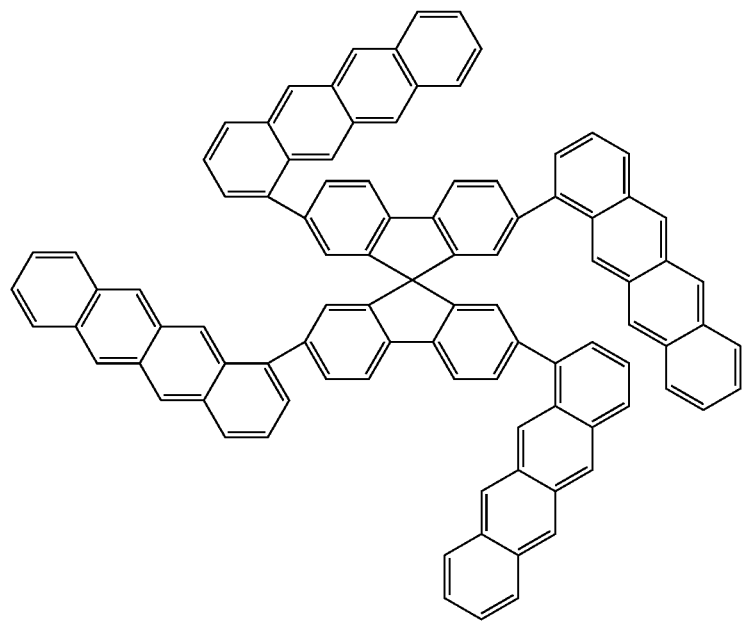
119
Typical examples of the compounds represented by the general formula [4] will be given below.
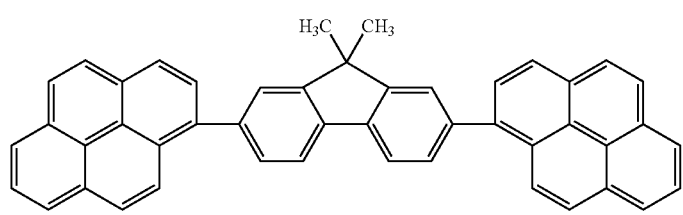
201
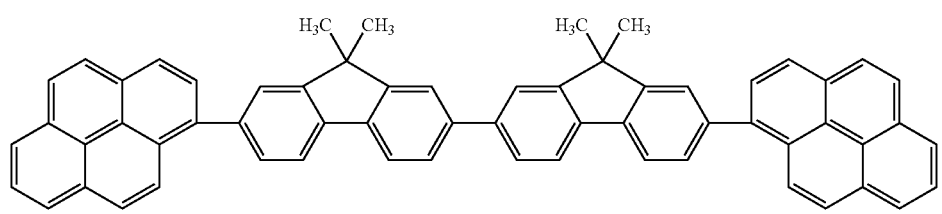
202
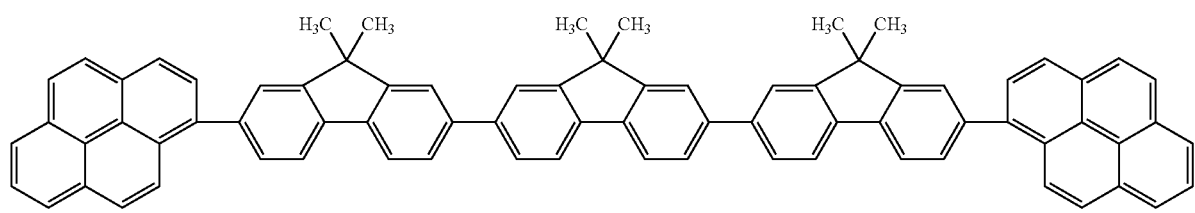
203
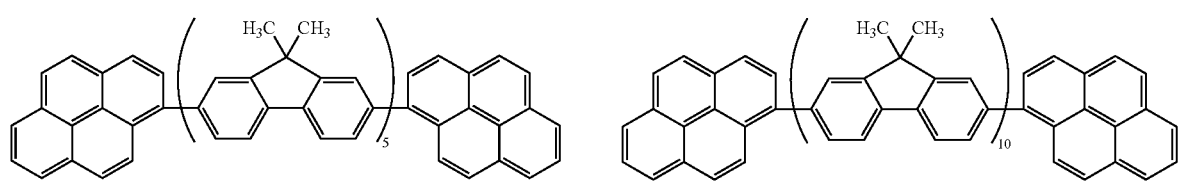
204 205

-continued
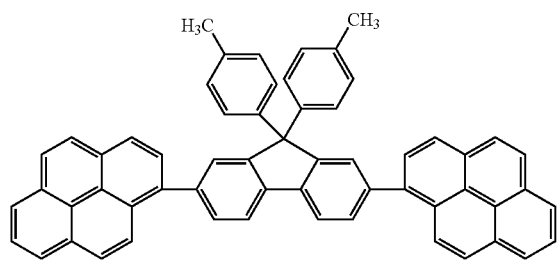
206
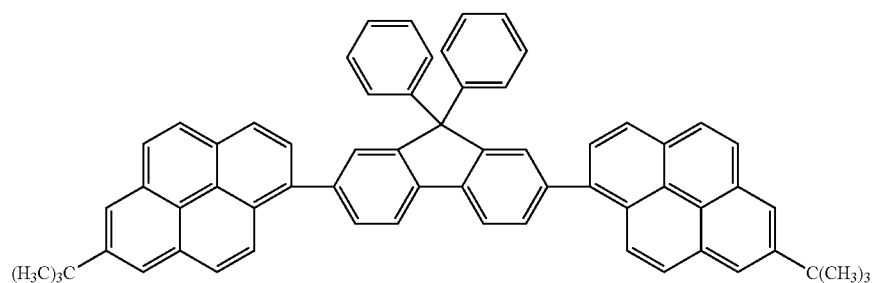
207
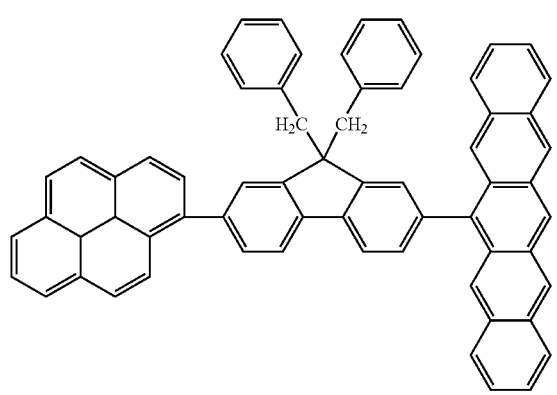
208
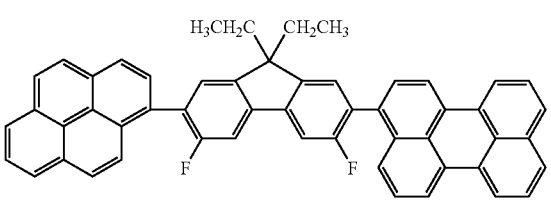
209
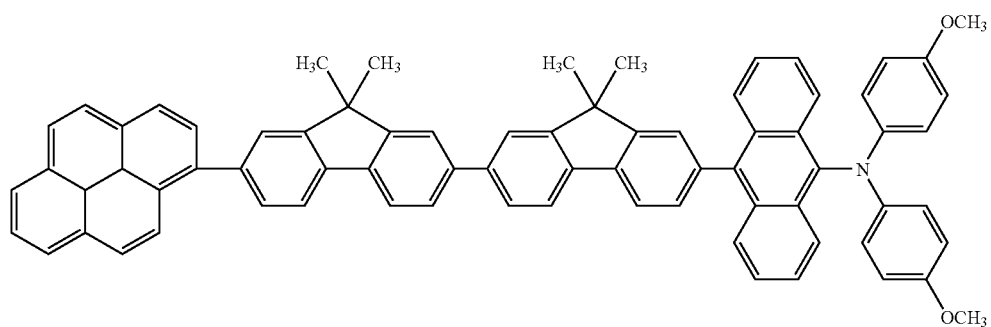
210
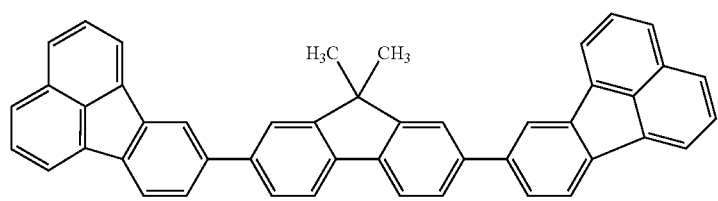
211

-continued
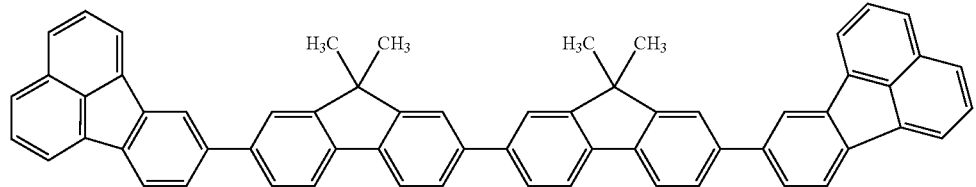
212
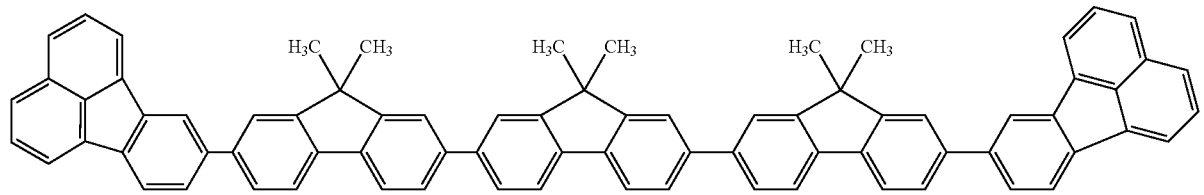
213
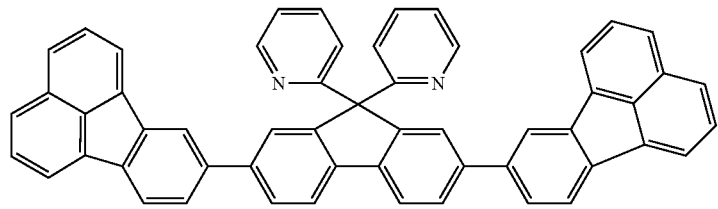
214
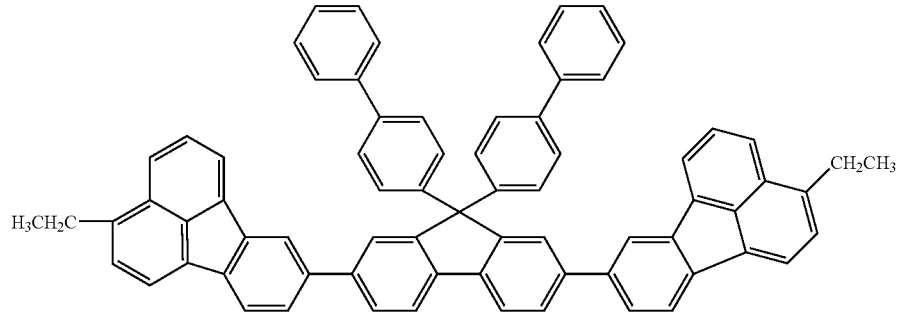
215
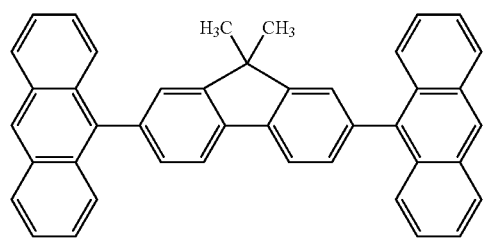
216
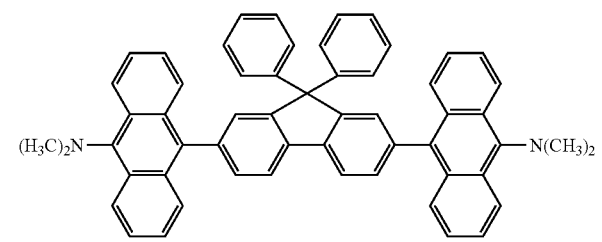
217
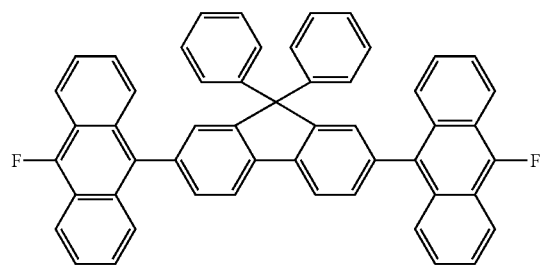
218
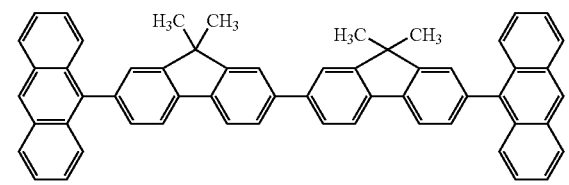
219

-continued
220
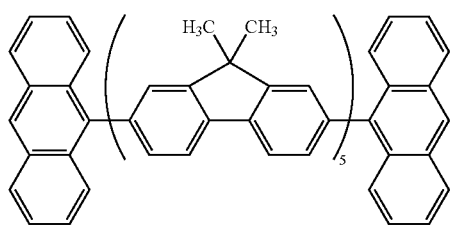
221
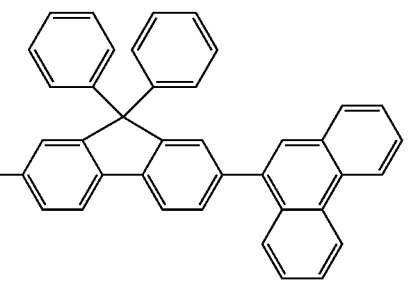
222
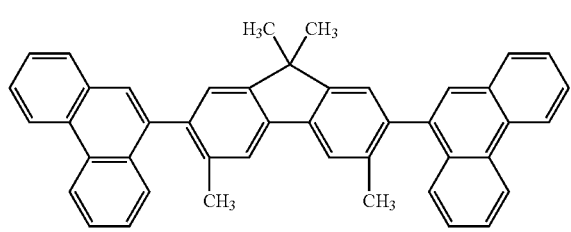
223
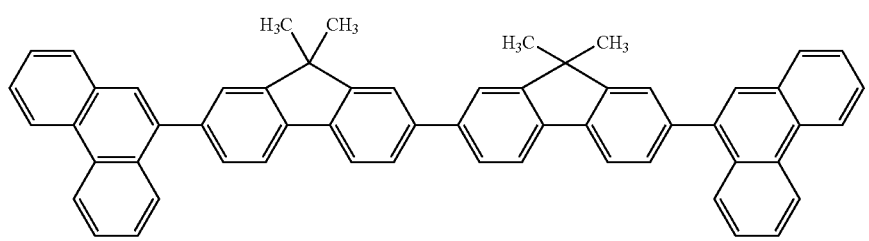
224
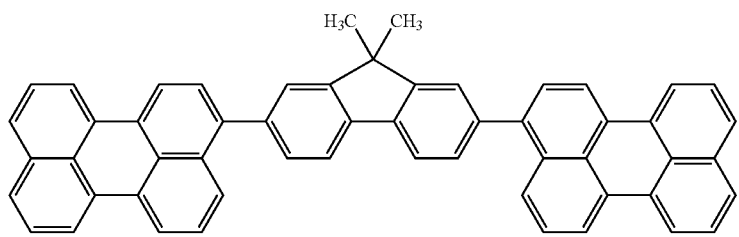
225
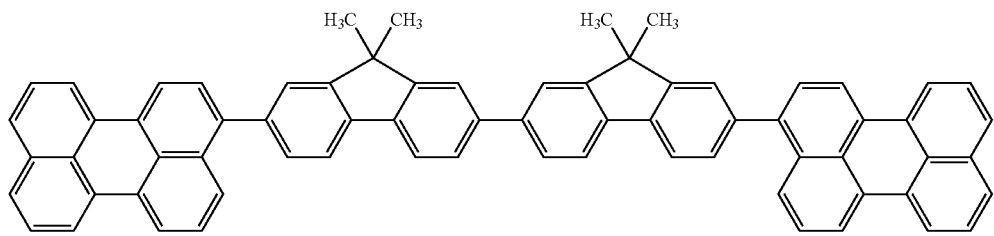
226
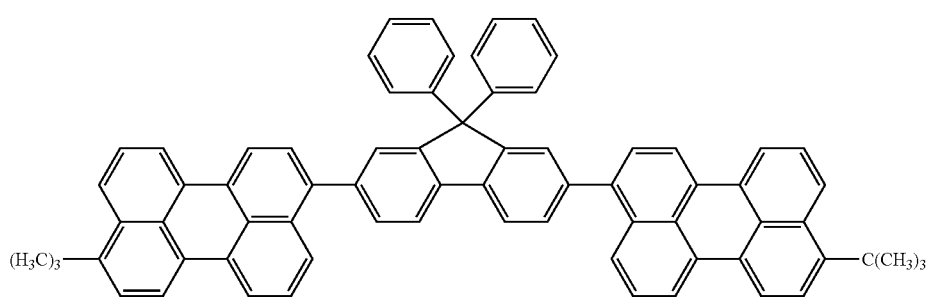

-continued
227 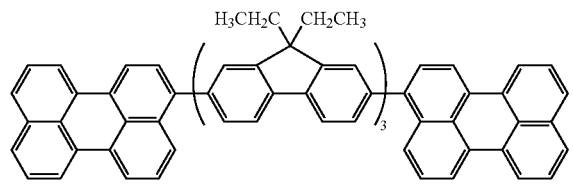 228 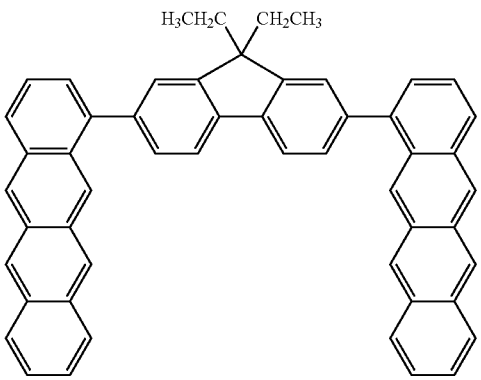
229 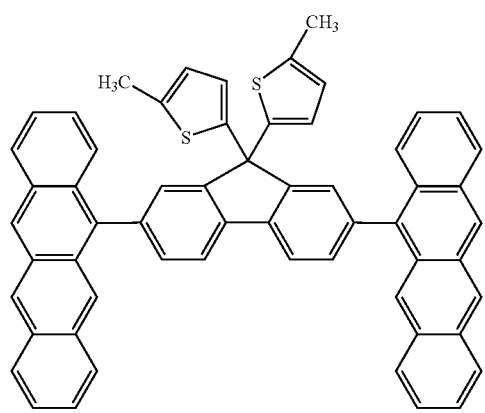
230 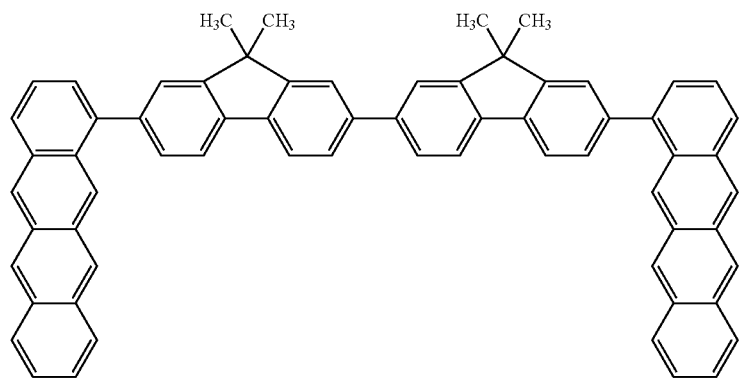
231 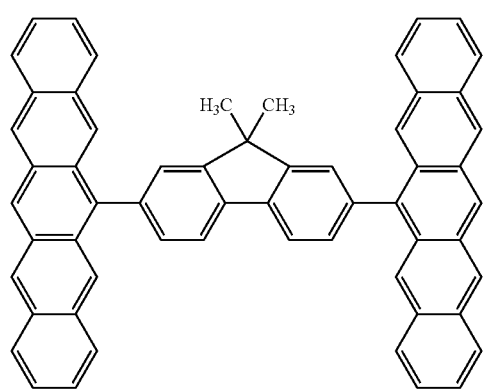 232 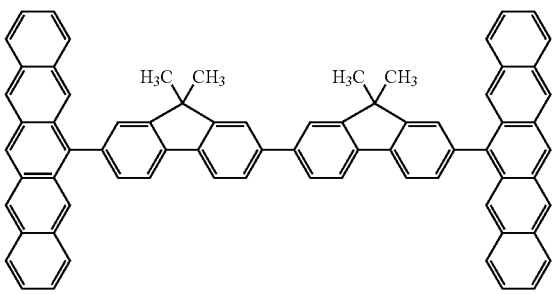

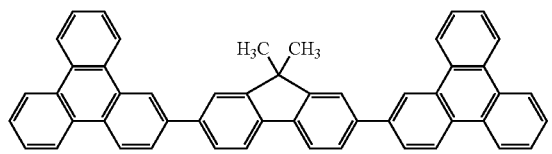

233

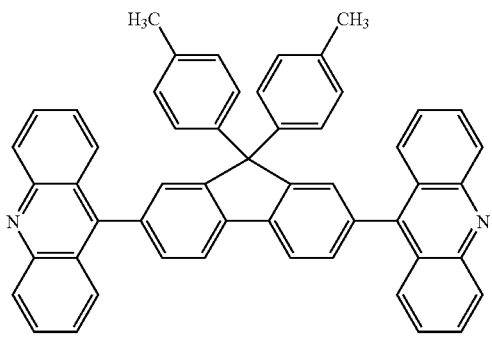

234

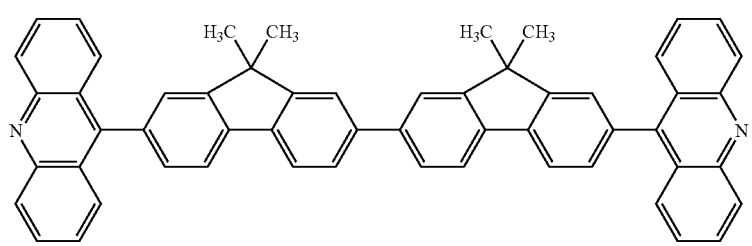

235

The present invention is focused on an organic layer in a light-emitting region, so that any materials which have been known in the art may be used as materials for other organic layers (e.g., hole-injection, hole-transporting, and electron-transporting layers).

Those compounds will be exemplified below.

A preferable hole-injection transporting material has excellent mobility to facilitate the injection of a hole from an anode and to transport the injected hole to a light-emitting layer. Low molecular and high molecular materials having hole-injecting and transporting abilities include a triarylamine derivative, a phenylene diamine derivative, a triazole derivative, an oxadiazole derivative, an imidazole derivative, a pyrazoline derivative, a pyrazolone derivative, an oxazole derivative, a fluorenone derivative, a hydrazone derivative, a stilbene derivative, a phthalocyanine derivative, a porphyrin derivative, and poly(vinylcarbazole), poly(silylene), poly(thiophene), and other conductive polymers. However, the material is not limited to those compounds. Hereinafter, some of specific examples of the material will be described.

Low Molecular Hole-injection Transporting Materials:

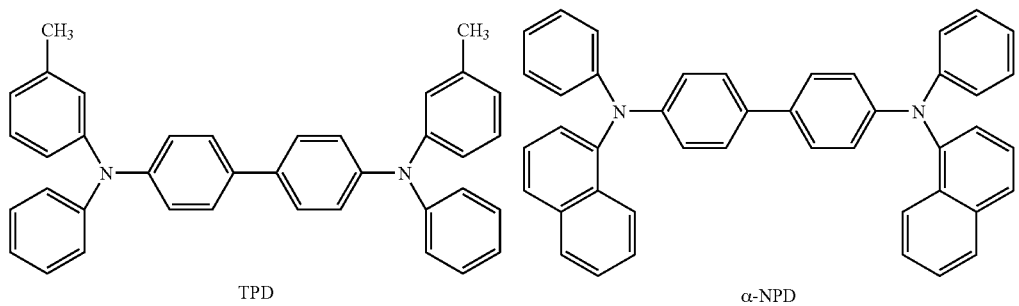

TPD

α-NPD

-continued
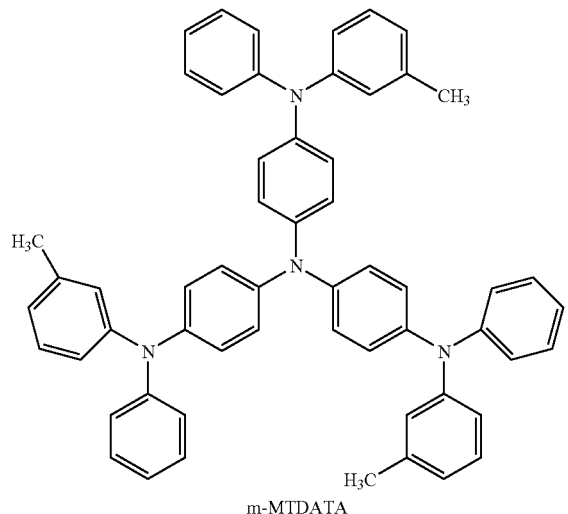
m-MTDATA
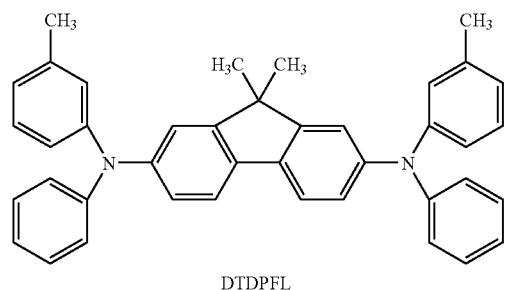
DTDPFL
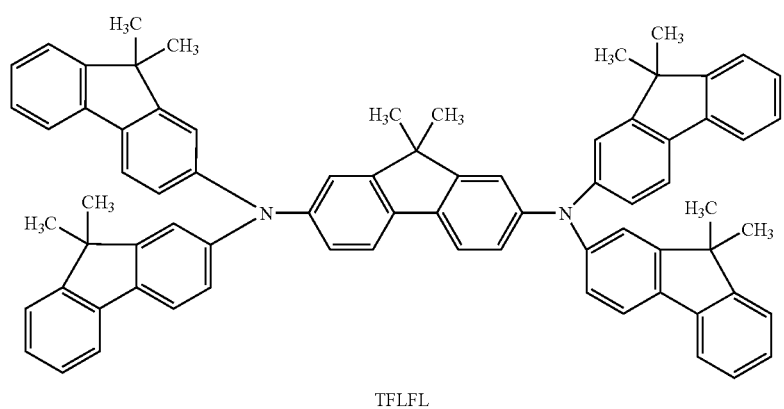
TFLFL
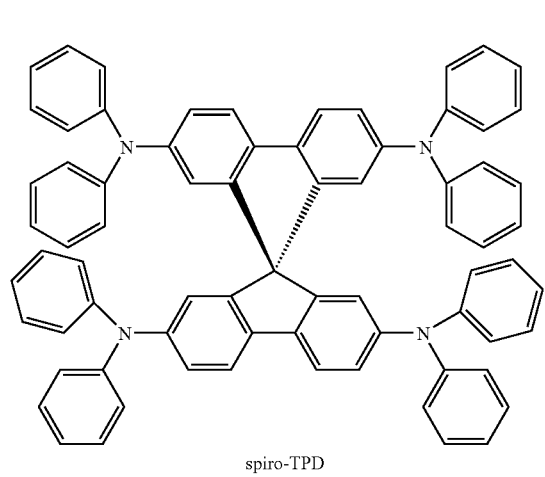
spiro-TPD
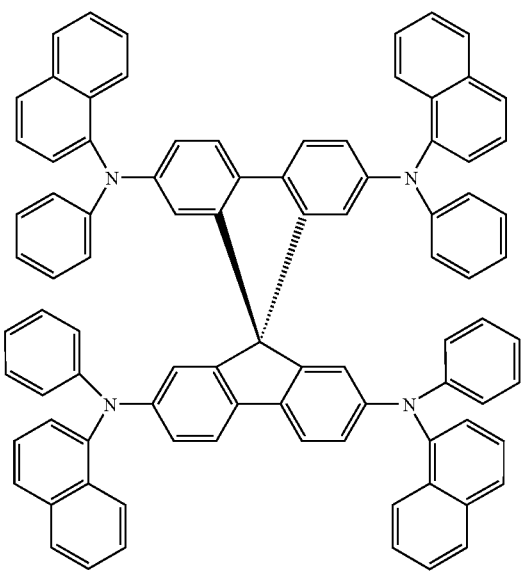
spiro-NPD -continued
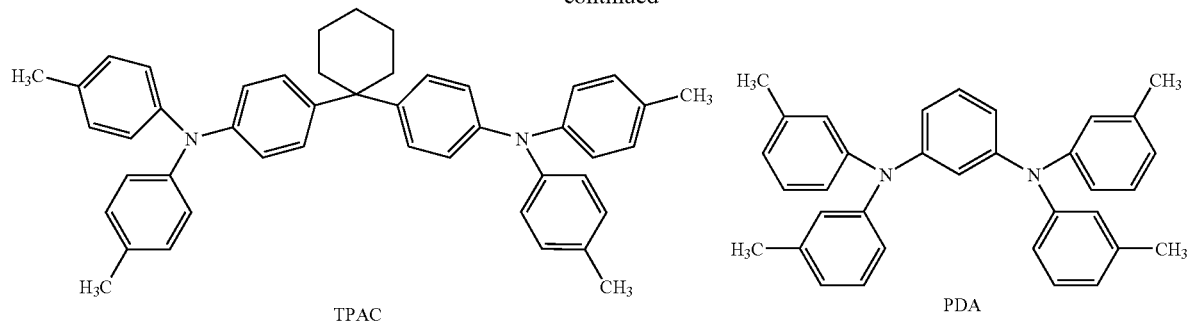
TPAC
PDA
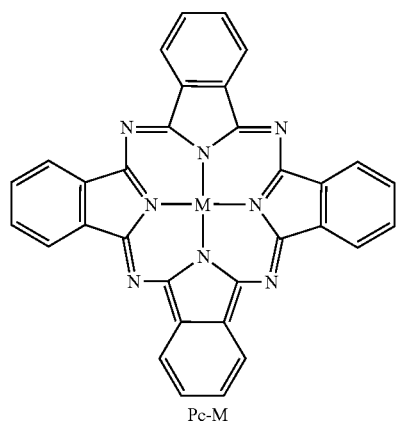
Pc-M
M: Cu, Mg, AlCl,
TiO, SiCl₂, Zn, Sn,
MnCl, GaCl, etc
High Molecular Hole-transporting Materials:
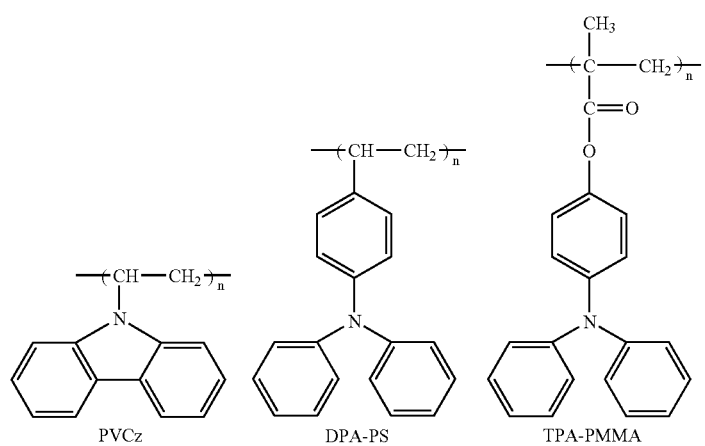
PVCz          DPA-PS          TPA-PMMA -continued
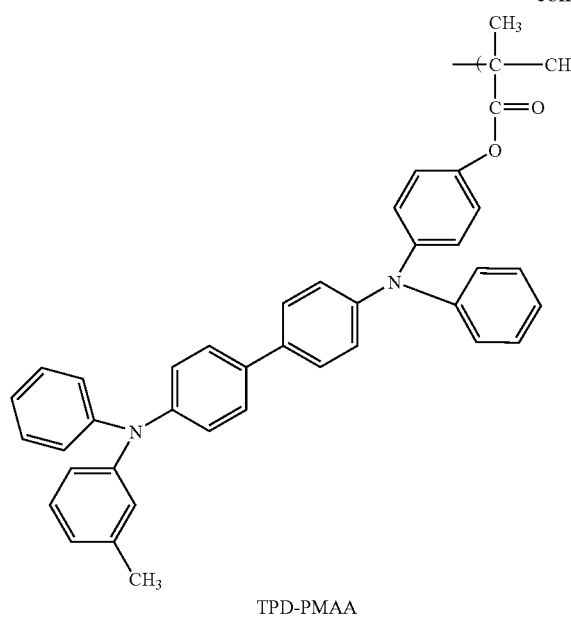
TPD-PMAA
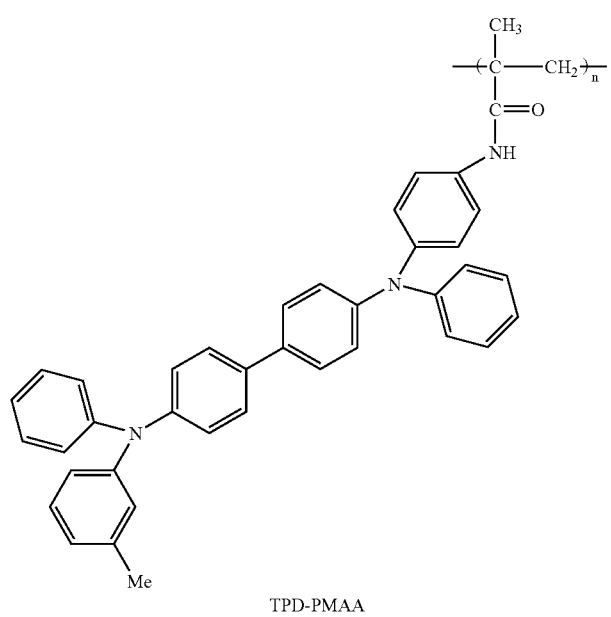
TPD-PMAA
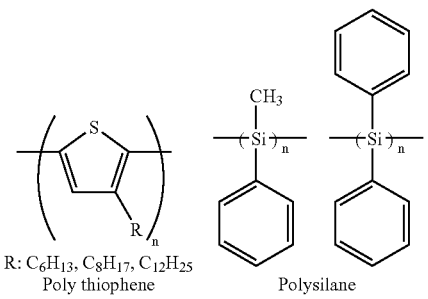
R: $C_6H_{13}$, $C_8H_{17}$, $C_{12}H_{25}$
Poly thiophene        Polysilane
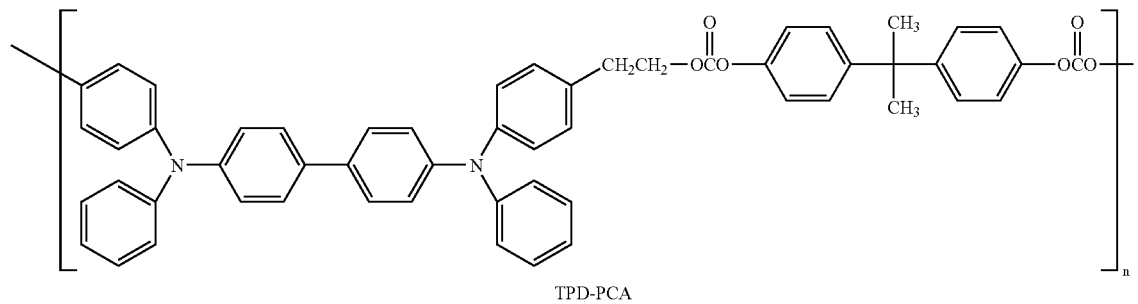
TPD-PCA The electron-injection transporting material may be arbitrarily selected from compounds each of which facilitates the injection of an electron from a cathode and each of which has a function of transporting the injected electron to a light-emitting layer in consideration of, for example, a balance with the carrier mobility of the hole-transporting material. The materials having electron-injection transporting abilities include an oxadiazole derivative, an oxazole derivative, a thiazole derivative, a thiadiazole derivative, a pyrazine derivative, a triazole derivative, a triazine derivative, a perylene derivative, a quinoline derivative, a quinoxaline derivative, a fluorenone derivative, an anthrone derivative, a phenanthroline derivative, and an organometallic complex. However, the material is not limited to those compounds. Some of specific examples of the compounds will be described below.

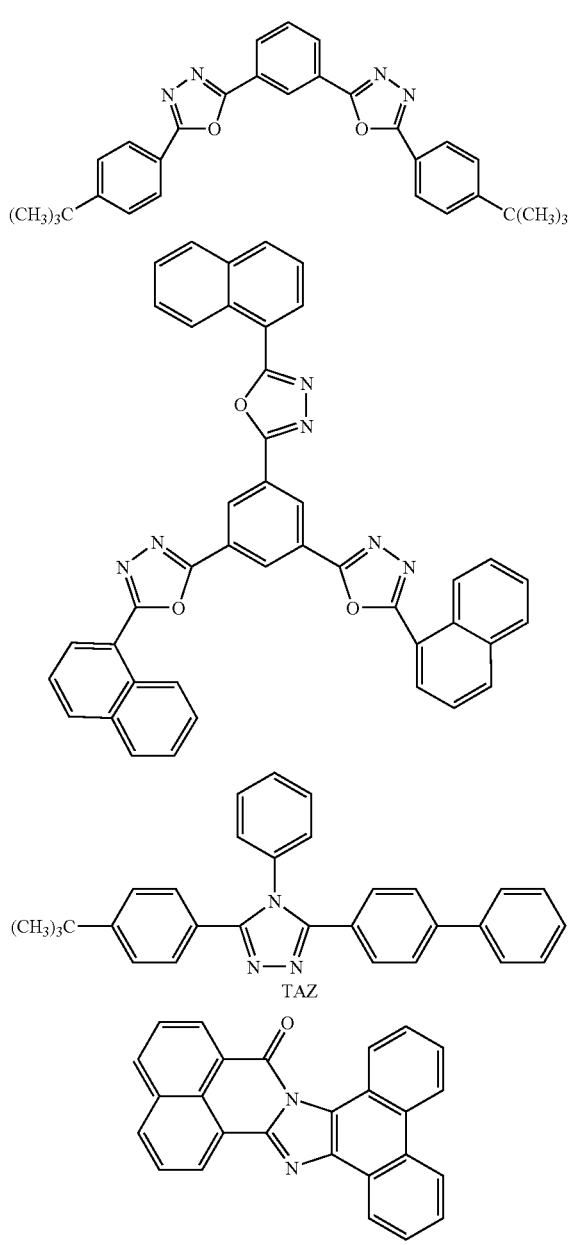

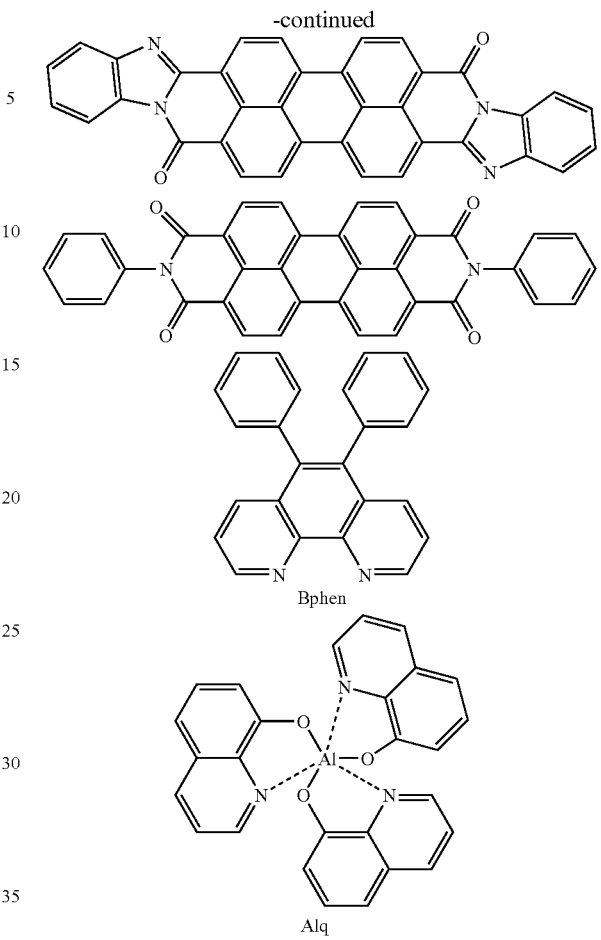

In the organic electroluminescent devices according to the present invention, each layer containing an organic compound can be prepared as a thin film generally by a vacuum evaporation method, an ionization deposition method, sputtering, plasma, or a conventional coating method (e.g., a spin coating, dipping, casting, LB, or inkjet method) in which the compound is dissolved in an appropriate solvent. In the case of forming a film with the coating method, in particular, a film may be formed using the compound in combination with an appropriate binder resin.

The above binder resins may be chosen from a wide variety of binder resins. Examples thereof include, but are not limited to, polyvinylcarbazole resins, polycarbonate resins, polyester resins, polyallylate resins, polystyrene resins, ABS resins, polybutadine resins, polyurethane resins, acrylic resins, methacrylic resins, butyral resins, polyvinyl acetal resins, polyamide resins, polyimide resins, polyethylene resins, polyethersulfone resins, diallyl phthalate resins, phenol resins, epoxy resins, silicone resins, polysulfone resins, and urea resin. Each of those may also be used singly. Alternatively, two or more of them may be mixed in combination as copolymers. Further, additives such as known plasticizers, antioxidants and ultraviolet absorbers may be used in combination if required.

A desirable anode material has as large a work function as possible. Examples of available materials include: metals such as gold, platinum, silver, copper, nickel, palladium, cobalt, selenium, vanadium, and tungsten, and alloys thereof; and metal oxides such as tin oxide, zinc oxide, indium oxide, indium tin oxide (ITO), and indium zinc oxide. Further, conductive polymers such as polyaniline, polypyrrole, polythiophene, and polyphenylene sulfide may also be used. Each of those electrode substances may be used singly. Alternatively, two or more of them may also be used in combination. Further, the anode may adopt any one of a single layer construction and a multilayer construction.

On the other hand, a desirable cathode material has as small a work function as possible. Examples of available materials include: metals such as lithium, sodium, potassium, calcium, magnesium, aluminum, indium, ruthenium, titanium, manganese, yttrium, silver, lead, tin, and chromium; and alloys composed of multiple metals such as lithium-indium, sodium-potassium, magnesium-silver, aluminum-lithium, aluminum-magnesium, and magnesium-indium alloys. Metal oxides such as indium tin oxide (ITO) may also be used. Each of those electrode substances may be used singly. Alternatively, two or more of them may also be used in combination. Further, the cathode may adopt any one of a single layer construction and a multilayer construction.

In addition, at least one of the anode and cathode is preferably transparent or translucent.

Substrates which may be used in the present invention include: opaque substrates such as metal substrates and ceramics substrates; and transparent substrates such as glass, quartz, and plastic sheet substrate, but are not particularly limited to these materials. In addition, the substrate may be a color filter film, a fluorescent color converting film, a dielectric reflection film, or the like to control colored light.

Furthermore, a protective layer or a sealing layer may be formed on the prepared device to prevent the device from contacting with oxygen, moisture, or the like. The protective layer may be a diamond thin film, a film made of an inorganic material such as metal oxide or metal nitride, a polymer film made of a fluorine resin, polyparaxylene, polyethylene, silicone resin, polystyrene resin, or the like, or may be a photocuring resin, or the like. Furthermore, the device itself may be covered with glass, an airtight film, metal, or the like and packaged with an appropriate sealing resin.

EXAMPLES

Hereinafter, the present invention will be described more specifically with reference to examples thereof, but the invention is not limited to each of these examples.

Example 1

An organic electroluminescent device having the configuration shown in FIG. 3 was prepared by a method described below.

A film was formed on a glass substrate provided as a substrate 1 by sputtering indium tin oxide (ITO) as an anode 2 with a film thickness of 120 nm. Subsequently, the substrate was subjected to ultrasonic cleaning in acetone and isopropyl alcohol (IPA) in order. Next, the substrate was boiled and washed with IPA, followed by drying. Furthermore, the substrate was subjected to UV/ozone cleaning and used as a transparent conductive supporting substrate.

Using a compound represented by the following structural formula as a hole-transporting material, a chloroform solution was prepared to a concentration of 0.5% wt %.

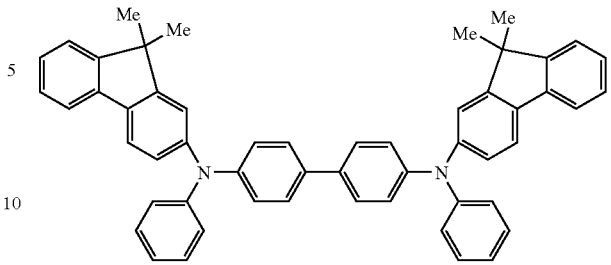

This solution was dropped onto the above ITO electrode. Subsequently, the ITO electrode was subjected to spin coating with the solution at a revolving speed of 500 rpm for 10 seconds at first and then 1,000 rpm for 1 minute to form a thin film thereon. After that, the resulting thin film was placed in a vacuum oven and dried at 80° C. for 10 minutes to completely remove the solvent in the film. Consequently, a hole-transporting layer 5 thus obtained was 50 nm in thickness. Next, Exemplified Compound No. 39 described above as a first compound and Exemplified Compound No. 201 described above as a second compound were subjected to co-deposition (weight ratio=10:90) to form a light-emitting layer 3 of 20 nm in thickness. In this case, the degree of vacuum at the time of deposition was $1.0 \times 10^{-4}$ Pa and the film formation was performed at a rate of 0.2 to 0.3 nm/second.

Further, using bathophenanthroline (Bphen), an electron-transporting layer 6 was formed to a thickness of 40 nm by a vacuum evaporation method. In this case, the degree of vacuum at the time of deposition was $1.0 \times 10^{-4}$ Pa and the film formation was performed at a rate of 0.2 to 0.3 nm/second.

Subsequently, using an aluminum-lithium alloy (lithium concentration=1 atom %) as a deposition material, a metal layer film of 10 nm in thickness was formed on the organic layer mentioned above, and successively an aluminum film of 150 nm in thickness was formed thereon by a vapor evaporation method. Consequently, an organic electroluminescent device in which the aluminum-lithium alloy film was provided as an electron injection electrode (cathode 4) was prepared. In this case, the degree of vacuum at the time of deposition was $1.0 \times 10^{-4}$ Pa and the film formation was performed at a rate of 1.0 to 1.2 nm/second.

The resulting organic electroluminescent device was covered with a protective glass and sealed with an acrylic resin binder in a dry air atmosphere to prevent the device from deteriorating with the adsorption of moisture thereon.

From the device thus obtained, the inventors observed the emission of blue-green light with a light-emitting luminance of 900 cd/m², a light-emitting efficiency of 8 lm/w, and a maximum light-emission wavelength of 490 nm at an applied voltage of 3.5 V when the ITO electrode (anode 2) was provided as a positive electrode and the Al—Li electrode (cathode 4) was provided as a negative electrode.

From the determination on an ionization potential with an measuring instrument named AC-1 (manufactured by Riken Kiki Co., Ltd.), and a band-gap measurement with ultraviolet through visual light absorption, the HOMO/LUMO level of Exemplified Compound No. 39 was estimated to be −5.58 eV/−2.86 eV, and the HOMO/LUMO level of Exemplified Compound No. 201 was estimated to be −5.70 eV/−2.78 eV. The inventors found that the band gap of the second compound was wider than that of the first compound, the HOMO level of the first compound was higher than that of the second compound, and the LUMO level of the first compound was lower than that of the second compound.

Furthermore, when a voltage was applied to the device for 100 hours under a nitrogen atmosphere while a current density was kept at 30 mA/cm$^2$, the rate of luminance degradation after 100 hours was extremely small because the luminance changed from the initial luminance of about 2,400 cd/m$^2$ to a luminance of about 2,150 cd/m$^2$.

Comparative Example 1

An organic electroluminescent device was prepared in the same manner as in Example 1, except that the following compound (tris(8-quinolinolato)-aluminum) was used as a second compound instead of Exemplified Compound No. 201, followed by subjecting the device to the same evaluation.

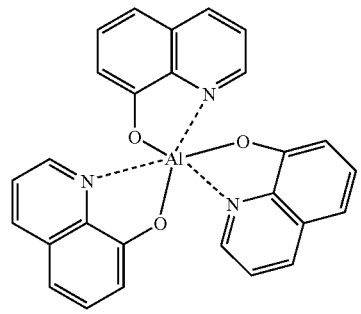

At an applied voltage of 3.5 V, the inventors observed the emission of green light with a light-emitting luminance of 200 cd/m$^2$, a light-emitting efficiency of 3 lm/W, and a maximum light-emission wavelength of 510 nm.

In addition, the HOMO/LUMO level of tris(8-quinolinolato)aluminum was estimated to be −5.70 eV/−3.01 eV.

In this case, the LUMO level of the second compound was lower then the LUMO level of the first compound. Thus, it was presumed that the light-emitting efficiency decreases as the probability of re-association between an electron and a hole on the first compound decreases.

Examples 2 to 5

Organic electroluminescent devices were prepared in the same manner as in Example 1, except that Exemplified Compound No. 37 was used as a first compound and the corresponding compounds listed in Table 1 were used as second compounds, followed by subjecting the devices to the same evaluation. The results are shown in Table 1.

TABLE 1

| Example | Second compound Exemplified Compound No. | Applied voltage (V) | Luminance (cd/m$^2$) | Efficiency (lm/W) |
|---|---|---|---|---|
| 2 | 101 | 3.5 | 750 | 8 |
| 3 | 107 | 3.5 | 1,400 | 10 |
| 4 | 201 | 3.5 | 2,100 | 11 |
| 5 | 212 | 3.5 | 900 | 8 |

In each of the examples, the inventors observed the emission of green light with a maximum light-emission wavelength of 510 nm derived from Exemplified Compound No. 37.

Furthermore, in each of the examples, the inventors found that the band gap of the second compound was wider than that of the first compound (Exemplified Compound No. 37), the HOMO level of the first compound was higher than that of the second compound, and the LUMO level of the first compound was lower than that of the second compound.

Furthermore, when a voltage was applied on the organic electroluminescent device of Example 2 for 100 hours under a nitrogen atmosphere while a current density was kept at 30 mA/cm$^2$, the rate of luminance degradation after 100 hours was extremely small because the luminance changed from the initial luminance of about 2,500 cd/m$^2$ to a luminance of about 2,200 cd/m$^2$.

Comparative Example 2

An organic electroluminescent device was prepared in the same manner as in Example 2, except that the following compound was used as a first compound, followed by subjecting the device to the same evaluation. At an applied voltage of 3.5 V, the inventors observed the emission of green light with a light-emitting luminance of 450 cd/m$^2$, a light-emitting efficiency of 5.0 lm/W, and a maximum light-emission wavelength of 505 nm.

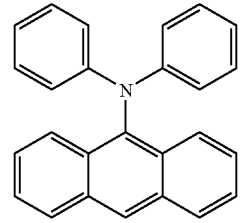

Furthermore, when a voltage was applied on the organic electroluminescent device for 100 hours under a nitrogen atmosphere while a current density was kept at 30 mA/cm$^2$, the rate of luminance degradation after 100 hours was large because the luminance changed from the initial luminance of about 1,700 cd/m$^2$ to a luminance of about 800 cd/m$^2$.

Examples 6 to 9

Organic electroluminescent devices were prepared by the same way as that of Example 1, except that Exemplified Compound No. 22 was used as a first compound and the corresponding Exemplified Compounds listed in Table 1 were used as their second compounds, respectively and, the co-deposition ratio of a light-emitting layer was 15:85 (weight ratio). Then, the devices were subjected to the same evaluation as that of Example 1. The results are listed in Table 2, respectively.

TABLE 2

| Example | Second compound Exemplified Compound No. | Applied voltage (V) | Luminance (cd/m$^2$) | Efficiency (lm/W) |
|---|---|---|---|---|
| 6 | 101 | 3.5 | 350 | 8 |
| 7 | 107 | 3.5 | 700 | 11 |
| 8 | 201 | 3.5 | 1,050 | 14 |
| 9 | 212 | 3.5 | 500 | 10 |

In each of the examples, the inventors observed the emission of green light with a maximum light-emission wavelength of 530 nm derived from Exemplified Compound No. 22.

Furthermore, in each of the examples, the inventors found that the band gap of the second compound was wider than that of the first compound (Exemplified Compound No. 22), the HOMO level of the first compound was higher than that of the second compound, and the LUMO level of the first compound was lower than that of the second compound.

Examples 10 to 13

Organic electroluminescent devices were prepared in the same manner as in Example 1, except that Exemplified Compound No. 34 was used as a first compound and the corresponding Exemplified Compounds listed in Table 1 were used as their second compounds, respectively and, the co-deposition ratio of a light-emitting layer was 35:65 (weight ratio). Then, the devices were subjected to the same evaluation as that of Example 1. The results are listed in Table 3, respectively.

TABLE 3

| Example | Second compound Exemplified Compound No. | Applied voltage (V) | Luminance (cd/m$^2$) | Efficiency (lm/W) |
|---|---|---|---|---|
| 10 | 101 | 3.5 | 1,100 | 10 |
| 11 | 107 | 3.5 | 2,600 | 15 |
| 12 | 201 | 3.5 | 3,900 | 17 |
| 13 | 212 | 3.5 | 1,900 | 12 |

In each of the examples, the inventors observed the emission of yellow-green light with a maximum light-emission wavelength of 535 nm derived from Exemplified Compound No. 34.

Furthermore, in each of the examples, the inventors found that the band gap of the second compound was wider than that of the first compound (Exemplified Compound No. 34), the HOMO level of the first compound was higher than that of the second compound, and the LUMO level of the first compound was lower than that of the second compound.

Example 14

An organic electroluminescent device was prepared by the same way as that of Example 1, except that Exemplified Compound No. 40 was used as a first compound, Exemplified Compound No. 202 was used as a second compound, and the co-deposition ratio of a light-emitting layer was 20:80 (weight ratio), followed by subjecting the device to the same evaluation. At an applied voltage of 3.5 V, the inventors observed the emission of green light with a light-emitting luminance of 2000 cd/m$^2$, a light-emitting efficiency of 13 lm/W, and a maximum light-emission wavelength of 530 nm derived from Exemplified Compound 40.

From the determination on an ionization potential and a band-gap measurement with ultraviolet through visual light absorption, the HOMO/LUMO level of Exemplified Compound No. 40 was estimated to be −5.51 eV/−3.10 eV, and the HOMO/LUMO level of Exemplified Compound No. 202 was estimated to be −5.73 eV/−2.85 eV. The inventors found that the band gap of the second compound was wider than that of the first compound, the HOMO level of the first compound was higher than that of the second compound, and the LUMO level of the first compound was lower than that of the second compound.

Example 15

An organic electroluminescent device was prepared by the same way as that of Example 1, except that Exemplified Compound No. 48 was used as a first compound, Exemplified Compound No. 101 was used as a second compound, and the co-deposition ratio of a light-emitting layer was 5:95 (weight ratio), followed by subjecting the device to the same evaluation. At an applied voltage of 4.0 V, the inventors observed the emission of blue light with a light-emitting luminance of 500 cd/m$^2$, a light-emitting efficiency of 4 lm/W, and a maximum light-emission wavelength of 450 nm derived from Exemplified Compound 48.

From the determination on an ionization potential and a band-gap measurement with ultraviolet through visual light absorption, the HOMO/LUMO level of Exemplified Compound No. 48 was estimated to be −5.75 eV/−2.85 eV, and the HOMO/LUMO level of Exemplified Compound No. 101 was estimated to be −5.81 eV/−2.76 eV. The inventors found that the band gap of the second compound was wider than that of the first compound, the HOMO level of the first compound was higher than that of the second compound, and the LUMO level of the first compound was lower than that of the second compound.

Example 16

An organic electroluminescent device was prepared by the same way as that of Example 1, except that Exemplified Compound No. 57 was used as a first compound, Exemplified Compound No. 201 was used as a second compound, and the co-deposition ratio of a light-emitting layer was 35:65 (weight ratio), followed by subjecting the device to the same evaluation. At an applied voltage of 3.5 V, the inventors observed the emission of yellow-green light with a light-emitting luminance of 3,100 cd/m$^2$, a light-emitting efficiency of 13 lm/W, and a maximum light-emission wavelength of 540 nm derived from Exemplified Compound 57.

From the determination on an ionization potential and a band-gap measurement with ultraviolet through visual light absorption, the HOMO/LUMO level of Exemplified Compound No. 57 was estimated to be −5.52 eV/−3.10 eV, and the HOMO/LUMO level of Exemplified compound No. 201 was estimated to be −5.70 eV/−2.78 eV. The inventors found that the band gap of the second compound was wider than that of the first compound, the HOMO level of the first compound was higher than that of the second compound, and the LUMO level of the first compound was lower than that of the second compound.

Example 17

An organic electroluminescent device was prepared by the same way as that of Example 1, except that Exemplified Compound No. 4 was used as a first compound, Exemplified Compound No. 201 was used as a second compound, and the co-deposition ratio of a light-emitting layer was 35:65 (weight ratio), followed by subjecting the device to the same evaluation. At an applied voltage of 3.5 V, we observed the emission of green light with a light-emitting luminance of 3,900 cd/m$^2$, a light-emitting efficiency of 18 lm/W, and a maximum light-emission wavelength of 530 nm derived from Exemplified Compound 4.

From the determination on an ionization potential and a band-gap measurement with ultraviolet through visual light absorption, the HOMO/LUMO level of Exemplified Compound No. 4 was estimated to be −5.49 eV/−2.99 eV, and the HOMO/LUMO level of Exemplified Compound No. 201 was estimated to be −5.70 eV/−2.78 eV. The inventors found that the band gap of the second compound was wider than that of the first compound, the HOMO level of the first compound was higher than that of the second compound, and the LUMO level of the first compound was lower than that of the second compound.

A voltage was applied to the organic electroluminescent device prepared in Example 17 for 100 hours while a current density was kept at 10 mA/cm² under a nitrogen atmosphere. Consequently, the rate of luminance degradation after 100 hours was small because the luminance changed from the initial luminance of about 2,000 cd/m² to a luminance of about 1,800 cd/m².

Example 18

An organic electroluminescent device was prepared by the same way as that of Example 17, except that 2,9-bis[2-(9,9-dimethylfluorenyl)]phenanthroline was used in an electron-transporting layer, followed by subjecting the device to the same evaluation.

At an applied voltage of 3.5 V, the inventors observed the emission of green light with a light-emitting luminance of 3,900 cd/m², a light-emitting efficiency of 18 lm/W, and a maximum light-emission wavelength of 530 nm derived from Exemplified Compound 4.

Furthermore, a voltage was applied to the organic electroluminescent device prepared in Example 18 for 100 hours while a current density was kept at 10 mA/cm² under a nitrogen atmosphere. Consequently, the rate of luminance degradation after 100 hours was extremely small because the luminance changed from the initial luminance of about 2,000 cd/m² to a luminance of about 1,900 cd/m².

Comparing with Example 17, by changing the electron-transporting material, the inventors were able to alleviate a degradation in driving performance of the device while maintaining the same level of light-emitting efficiency. If another exemplified compound is used instead of one used in this example, the same effects may be obtained.

Example 19

An organic electroluminescent device was prepared by the same way as that of Example 1, except that Exemplified Compound No. 16 was used as a first compound, Exemplified Compound No. 201 was used as a second compound, and the co-deposition ratio of a light-emitting layer was 25:65 (weight ratio), followed by subjecting the device to the same evaluation. At an applied voltage of 3.5 V, the inventors observed the emission of green light with a light-emitting luminance of 3,300 cd/m², a light-emitting efficiency of 15 lm/W, and a maximum light-emission wavelength of 525 nm derived from Exemplified Compound 4.

From the determination on an ionization potential and a band-gap measurement with ultraviolet through visual light absorption, the HOMO/LUMO level of Exemplified Compound No. 4 was estimated to be −5.48 eV/−3.00 eV, and the HOMO/LUMO level of Exemplified Compound No. 201 was estimated to be −5.70 eV/−2.78 eV. The inventors found that the band gap of the second compound was wider than that of the first compound, the HOMO level of the first compound was higher than that of the second compound, and the LUMO level of the first compound was lower than that of the second compound.

According to the present invention, as described with reference to the embodiments and the examples, it becomes possible to provide an organic electroluminescent device having extremely high luminance, high efficiency, and stability over time.

What is claimed is:
1. An organic electroluminescent device comprising:
a pair of electrodes consisting of an anode and a cathode; and
one or more organic-compound-containing layers sandwiched between the pair of electrodes, wherein
among the organic-compound-containing layers, at least one layer having a light-emitting region contains a first compound represented by the following general formula [1] and a second compound having a band gap larger than a band gap of the first compound:

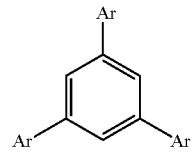

[1]

where each substituent Ar represents one selected independently from the following units [2] to [4]

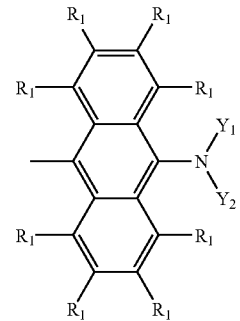

[2]

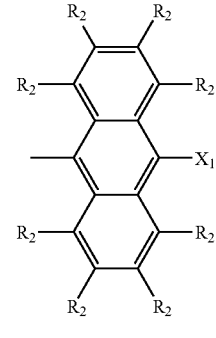

[3]

[4]

where:
$Y_1$ and $Y_2$ each represent one selected independently from the group consisting of substituted or unsubstituted alkyl group, substituted or unsubstituted aralkyl group, substituted or unsubstituted aryl group, and substituted or unsubstituted heterocyclic group, wherein $Y_1$ and $Y_2$ may be identical with or different from each other, wherein $Y_1$ and $Y_2$ may be linked together to form a ring, wherein $Y_1$ on different substituents Ar representing unit [2] (if two substituents Ar represent unit [2]) may be identical with or different from each other, wherein $Y_2$ on different substituents Ar representing unit [2] (if two substituents Ar represent unit [2]) may be identical with or different from each other;

$X_1$ represents one selected from the group consisting of a hydrogen atom, a heavy hydrogen atom, a halogen atom, substituted or unsubstituted alkyl group, substituted or unsubstituted alkenyl group, substituted or unsubstituted alkynyl group, substituted or unsubstituted aralkyl group, substituted or unsubstituted alkoxy group, substituted or unsubstituted sulfide group, substituted or unsubstituted aryl group, substituted or unsubstituted heterocyclic group, substituted silyl group, and substituted boranyl group, wherein $X_1$ on different substituents Ar representing unit [3] (if two substituents Ar represent unit [3]) may be identical with or different from each other;

each $R_1$ represents one selected independently from the group consisting of a hydrogen atom, a heavy hydrogen atom, a halogen atom, substituted or unsubstituted alkyl group, substituted or unsubstituted aryl group, substituted or unsubstituted alkoxy group, and substituted or unsubstituted amino group, wherein $R_1$ on different positions of a substituent Ar representing unit [2] may be identical with or different from each other, wherein $R_1$ on different substituents Ar representing unit [2] (if two substituents Ar represent unit [2]) may be identical with or different from each other;

each $R_2$ represents one selected independently from the group consisting of a hydrogen atom, a heavy hydrogen atom, a halogen atom, substituted or unsubstituted alkyl group, substituted or unsubstituted aryl group, substituted or unsubstituted alkoxy group, and substituted or unsubstituted amino group, wherein $R_2$ on different positions of a substituent Ar representing unit [3] may be identical with or different from each other, wherein $R_2$ on different substituents Ar representing unit [3] (if two substituents Ar represent unit [3]) may be identical with or different from each other;

$R_3$ represents one selected from the group consisting of a hydrogen atom, a heavy hydrogen atom, a halogen atom, substituted or unsubstituted alkyl group, and substituted or unsubstituted alkoxy group; and one or two substituents Ar represent unit [2], provided that if one substituent Ar represents unit [2], the other two substituents Ar both represent unit [3], and if two substituents Ar represent unit [2], the other one substitutent Ar represents unit [3] or unit [4].

2. An organic electroluminescent device according to claim 1 wherein
a HOMO level of the first compound is higher than a HOMO level of the second compound and a LUMO level of the first compound is lower than a LUMO level of the second compound.

3. An organic electroluminescent device according to claim 1 wherein the second compound is represented by the following general formula [5]:

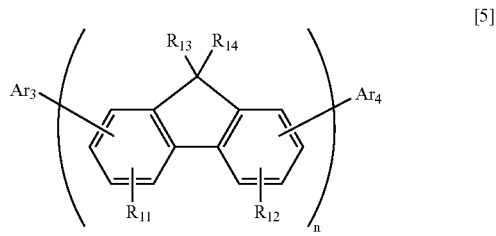

[5]

wherein
$R_{11}$ and $R_{12}$ each represent a hydrogen atom, a substituted or unsubstituted alkyl group, a substituted or unsubstituted aralkyl group, a substituted or unsubstituted aryl group, a substituted amino group, a cyano group, or a halogen atom, where $R_{11}$ and $R_{12}$ may be identical with or different from each other;

$R_{13}$ and $R_{14}$ each represent a hydrogen atom, a substituted or unsubstituted alkyl group, a substituted or unsubstituted aralkyl group, a substituted or unsubstituted heterocyclic group, where $R_{13}$ and $R_{14}$ may be identical with or different from each other;

Ar3 and Ar4 each represent a condensed polycyclic aromatic group substituted or unsubstituted with three or more benzene rings or a condensed polyheterocyclic group substituted or unsubstituted with three or more benzene rings, where $Ar_3$ and $Ar_4$ may be identical with or different from each other; and n represents an integer of 1 to 10.

* * * * *